(12) United States Patent
Kim

(10) Patent No.: US 12,302,547 B2
(45) Date of Patent: May 13, 2025

(54) MEMORY DEVICE AND METHOD OF MANUFACTURING THE MEMORY DEVICE

(71) Applicant: SK hynix Inc., Icheon-si (KR)

(72) Inventor: Jae Taek Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 411 days.

(21) Appl. No.: 17/826,812

(22) Filed: May 27, 2022

(65) Prior Publication Data

US 2023/0200047 A1  Jun. 22, 2023

(30) Foreign Application Priority Data

Dec. 20, 2021 (KR) .................... 10-2021-0182933

(51) Int. Cl.
*H10B 12/00* (2023.01)

(52) U.S. Cl.
CPC ............ *H10B 12/20* (2023.02); *H10B 12/09* (2023.02); *H10B 12/312* (2023.02)

(58) Field of Classification Search
CPC ...... H10B 12/20; H10B 12/09; H10B 12/312; H10B 43/40; H10B 43/50; H10B 43/27; H10B 43/30
See application file for complete search history.

(56) References Cited

U.S. PATENT DOCUMENTS

2021/0351128 A1\* 11/2021 Kim ................. H10B 43/27
2022/0384477 A1\* 12/2022 Kwon ............... H10B 43/27

FOREIGN PATENT DOCUMENTS

KR       1020080087418 A     10/2008
KR          102128465 B1      7/2020

\* cited by examiner

*Primary Examiner* — Allison Bernstein

(74) *Attorney, Agent, or Firm* — WILLIAM PARK & ASSOCIATES LTD.

(57) ABSTRACT

Provided herein may be a memory device and a method of manufacturing the memory device. The memory device may include a connection structure formed on a substrate, lower contacts formed on the connection structure, upper contacts formed on the lower contacts, a dummy pattern configured to enclose the lower contacts and spaced apart from the lower contacts, etching stop patterns formed in an upper region of the dummy pattern, and dummy contacts formed over the etching stop patterns.

20 Claims, 23 Drawing Sheets

MEMORY DEVICE AND METHOD OF MANUFACTURING THE MEMORY DEVICE

CROSS-REFERENCE TO RELATED APPLICATION

The present application claims priority under 35 U.S.C. § 119(a) to Korean patent application number 10-2021-0182933 filed on Dec. 20, 2021, in the Korean Intellectual Property Office, the entire disclosure of which is incorporated by reference herein.

BACKGROUND

1. Technical Field

Various embodiments of the present disclosure generally relate to a memory device and a method of manufacturing the memory device, and more particularly to a 3-dimensional (3D) memory device and a method of manufacturing the 3D memory device.

2. Related Art

In order to improve the degree of integration of a memory device, a 3D memory device including a plurality of memory cells arranged in three dimensions has been proposed.

A 3D memory device may include a cell region and a peripheral circuit region. The cell region may include a plurality of memory cells capable of storing data. The peripheral circuit region may include a plurality of transistors capable of controlling the memory cells.

With the increasing degree of integration of a 3D memory device, not only the sizes of elements included in a cell region or a peripheral circuit region but also the distance between the elements are reduced, which increases the degree of difficulty of a manufacturing process.

SUMMARY

An embodiment of the present disclosure may provide for a memory device. The memory device may include a connection structure formed on a substrate, lower contacts formed on the connection structure, upper contacts formed on the lower contacts, a dummy pattern configured to enclose the lower contacts and spaced apart from the lower contacts, etching stop patterns formed in the upper region of the dummy pattern, and dummy contacts formed over the etching stop patterns.

An embodiment of the present disclosure may provide for a method of manufacturing a memory device. The method may include providing a substrate in which a cell region and a peripheral region are defined, forming conductive patterns on the substrate of the cell region and the peripheral region, forming a lower contact between the conductive patterns in the peripheral region, forming etching stop patterns in the conductive patterns in the cell region and the peripheral region, forming a stacked structure on the etching stop patterns, forming holes configured to respectively expose the lower contact and the etching stop pattern in the stacked structure in the peripheral region, and forming a dummy contact contacting portions of the etching stop patterns and an upper contact contacting the lower contact by filling the holes formed in the peripheral region with a conductive material.

BRIEF DESCRIPTION OF THE DRAWINGS

FIGS. 6A, 6B, 6C, 6D, 6E, 6F, 6G, 6H, 6I, 6J, 6K, 6L, 6M, 6N, 6O, and 6P are views for explaining a method of manufacturing a memory device according to the present disclosure.

DETAILED DESCRIPTION

The specific structural or functional descriptions made below are intended for describing embodiments according to the concepts of the present disclosure. The embodiments according to the concepts of the present disclosure may be variously changed and replaced with other embodiments equivalent thereto, and are not to be construed as being limited to those described below.

Although the terms "first" and "second" may be used herein to describe various elements, the elements are not limited by these terms. The terms are used to distinguish one element from other elements.

Various embodiments of the present disclosure are directed to a memory device capable of preventing generation of a bridge, which is caused by a dummy contact when a manufacturing process for forming the dummy contact in a peripheral circuit region is performed, and a method of manufacturing the memory device. It will be understood that when an element, contact, structure, pattern, line, or layer etc., is referred to as being "on," "connected to" or "coupled to" another element, contact, structure, pattern, line, or layer etc., it can be directly on, connected or coupled to the other element, contact, structure, pattern, line, or layer etc., or intervening elements, contacts, structures, patterns, lines, or layers etc., may be present. In contrast, when an element, contact, structure, pattern, line, or layer etc., is referred to as being "directly on," "directly connected to" or "directly coupled to" another element, contact, structure, pattern, line, or layer etc., there are no intervening element, contact, structure, pattern, line, or layer etc., present.

Figure 1:
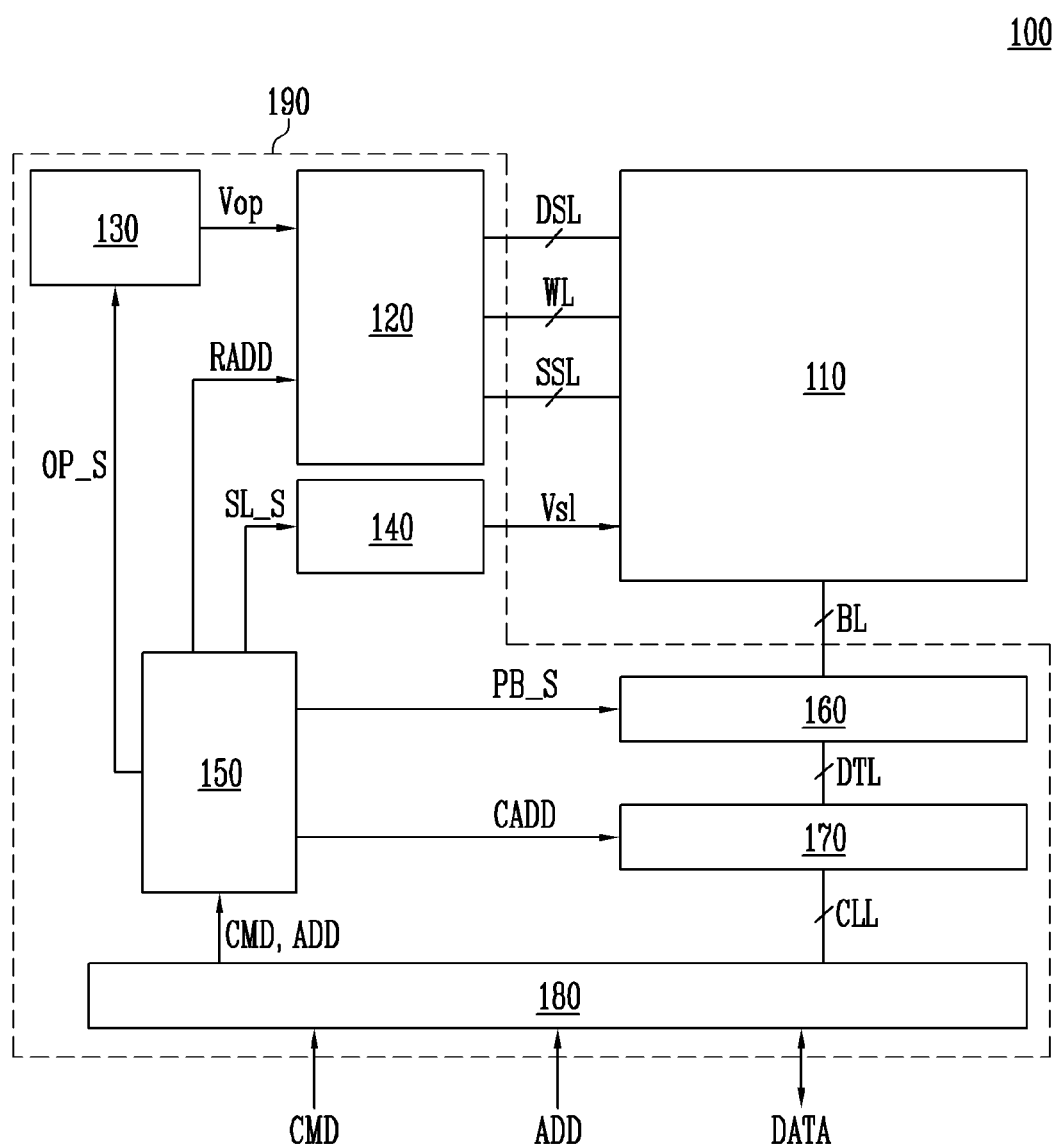
FIG. 1 is a diagram for explaining a memory device according to an embodiment of the present disclosure.

FIG. 1 is a diagram for explaining a memory device according to an embodiment of the present disclosure.

Referring to FIG. 1, the memory device 100 may include a memory cell array 110 and a peripheral circuit 190.

The memory cell array 110 may include a plurality of memory cells in which data is stored. As an embodiment, the memory cell array 110 may include a 3D memory cell array. Depending on the programming method, the plurality of memory cells may store 1-bit data or multi-bit data including two or more bits. The plurality of memory cells may configure a plurality of memory cell strings. For example, each of the memory cell strings may include a plurality of memory cells coupled in series through a channel layer. The channel layer may be coupled between a source line and a plurality of bit lines BL.

The peripheral circuit 190 may be configured to perform a program operation for storing data in the memory cell array 110, a read operation for outputting data stored in the memory cell array 110, and an erase operation for erasing data stored in the memory cell array 110. The peripheral circuit 190 may include a row decoder 120, a voltage generation circuit 130, a source line driver 140, a control circuit 150, a page buffer group 160, a column decoder 170, and an input/output circuit 180.

The row decoder 120 may be coupled to the memory cell array 110 through a plurality of drain select lines DSL, a plurality of word lines WL, and a plurality of source select lines SSL. The row decoder 120 may transfer operation voltages Vop to the plurality of drain select lines DSL, the plurality of word lines WL, and the plurality of source select lines SSL in response to a row address RADD.

The voltage generation circuit 130 may generate different operation voltages Vop, which are used for a program operation, a read operation, or an erase operation, in response to an operation signal OP_S.

The source line driver 140 may transmit a source voltage Vsl supplied therefrom to the source line coupled to the memory cell array 110 in response to a source line control signal SL_S.

The control circuit 150 may output an operation signal OP_S, a row address RADD, a source line control signal SL_S, a page buffer control signal PB_S, and a column address CADD in response to a command CMD and an address ADD.

The page buffer group 160 may include a plurality of page buffers coupled to the memory cell array 110 through bit lines BL. The page buffers may temporarily store data DATA received through the plurality of bit lines BL in response to a page buffer control signal PB_S. The page buffers may sense the voltages or currents of the plurality of bit lines BL at the time of a read operation.

The column decoder 170 may transmit data DATA input from the input/output circuit 180 to the page buffer 160 or transmit data DATA stored in the page buffer 160 to the input/output circuit 180 in response to a column address CADD. The column decoder 170 may send and receive data DATA to and from the input/output circuit 180 through column lines CLL. The column decoder 170 may send and receive data DATA to and from the page buffer 160 through data lines DTL.

The input/output circuit 180 may transfer a command CMD and an address ADD received from an external device (e.g., a controller) of the memory device 100 to the control circuit 150, and may output data read from selected memory cells to the external device at the time of a read operation.

Figure 2:
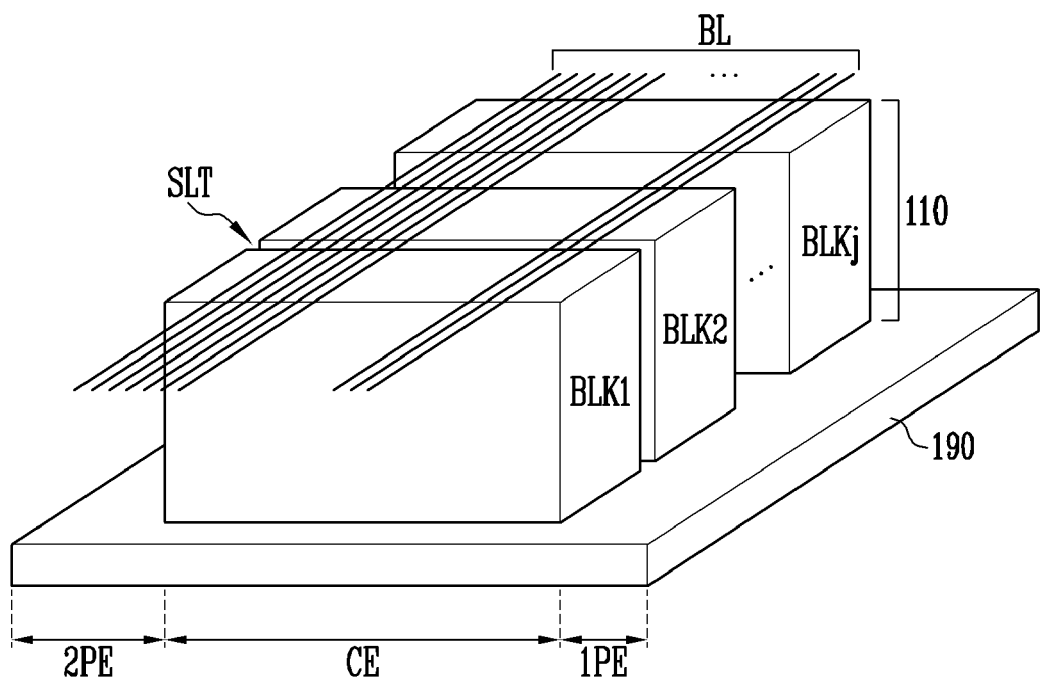
FIG. 2 is a diagram for explaining the disposition of a memory cell array and a peripheral circuit.

FIG. 2 is a diagram for explaining the disposition of a memory cell array and a peripheral circuit.

Referring to FIG. 2, a memory device 100 may include a peripheral circuit 190 and a memory cell array 110. The peripheral circuit 190 may be disposed over a substrate, and the memory cell array 110 may be disposed over the peripheral circuit 190. The memory cell array 110 may include first to j-th memory blocks BLK1 to BLKj. A plurality of bit lines BL may be disposed over the first to j-th memory blocks BLK1 to BLKj.

The plurality of bit lines BL may be arranged to be spaced apart from each other along an X direction, and may extend along a Y direction. The first to j-th memory blocks BLK1 to BLKj may be arranged to be spaced apart from each other along the Y direction. The first to j-th memory blocks BLK1 to BLKj may be separated from each other by slits SLT.

When the region in which the first to j-th memory blocks BLK1 to BLKj are formed is defined as a cell region CE, a first peripheral region 1PE may be defined in the X direction with respect to the cell region CE, and a second peripheral region 2PE may be defined in a −X direction with respect to the cell region CE. Because the first to j-th memory blocks BLK1 to BLKj are formed over the peripheral circuit 190, the first to j-th memory blocks BLK1 to BLKj and a portion of the peripheral circuit 190 may be electrically connected to each other through the first or second peripheral region 1PE or 2PE. The first and second peripheral regions 1PE and 2PE may include various patterns for a process of manufacturing the memory device 100, and may include transistors functioning as a peripheral circuit.

Because the first to j-th memory blocks BLK1 to BLKj are configured to be the same as each other, the first memory block BLK1 is taken as an example, and a detailed description thereof will be made below.

Figure 3:
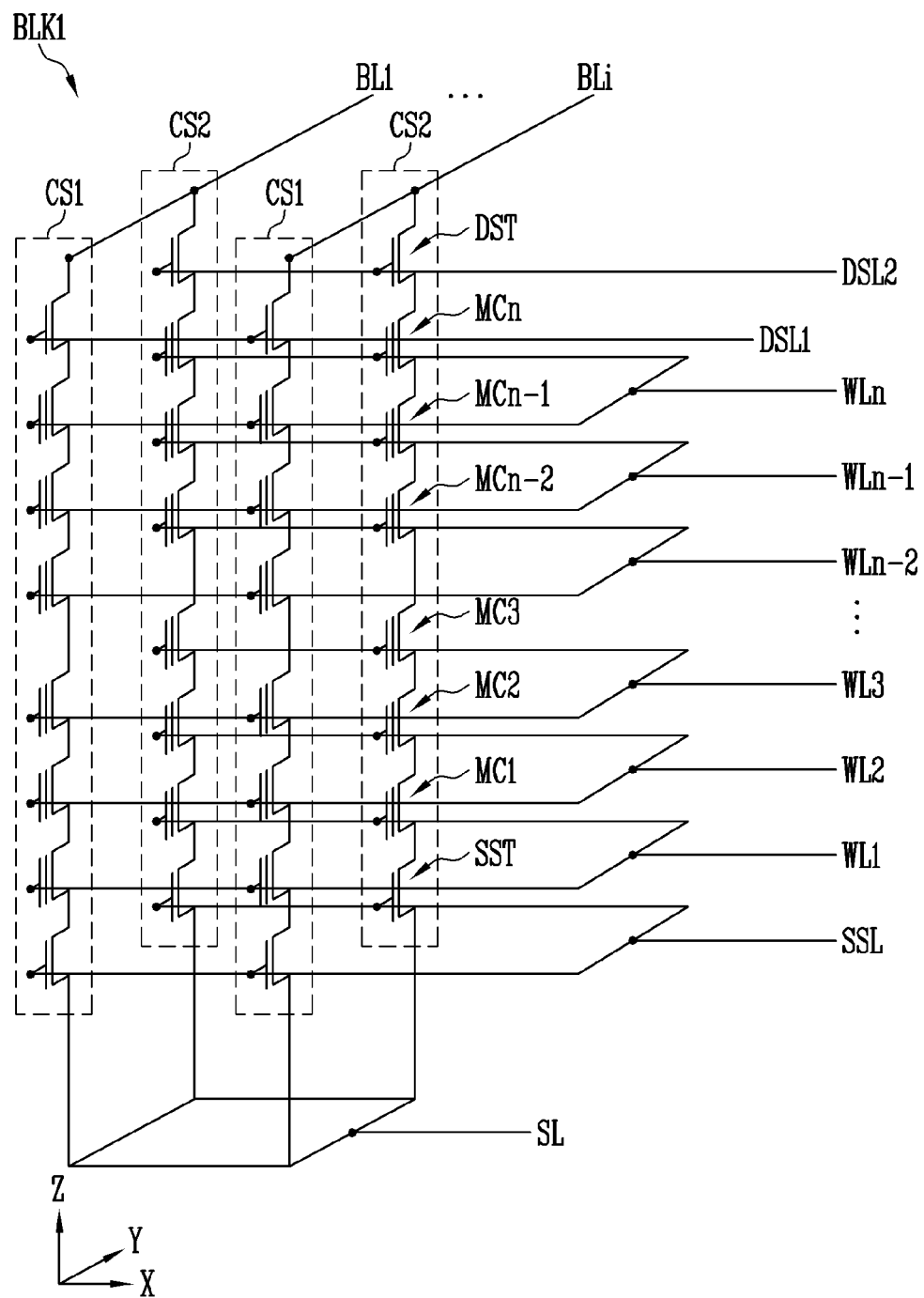
FIG. 3 is a diagram for explaining a memory block.

FIG. 3 is a diagram for explaining a memory block.

Referring to FIG. 3, first and second memory cell strings CS1 and CS2 coupled to first to i-th bit lines BL1 to BLi (i being a positive integer) may be coupled to the first memory block BLK1. Although two memory cell strings CS1 and CS2 are coupled to a single bit line in FIG. 3, the number of memory cell strings coupled to a single bit line is not limited to the number illustrated in the drawing.

The first and second memory cell strings CS1 and CS2 may be coupled between a source line SL and the first to i-th bit lines BL1 to BLi. The source line SL may be coupled to the first and second memory cell strings CS1 and CS2.

Each of the first memory cell strings CS1 and the second memory cell strings CS2 may include a source select transistor SST, a plurality of memory cells MC1 to MCn, and a drain select transistor DST, which are coupled between the source line SL and the first to i-th bit lines BL1 to BLi.

The source select transistor SST may control electrical connection between the plurality of memory cells MC1 to MCn and the source line SL. At least one source select transistor SST may be coupled between the source line SL and the plurality of memory cells MC1 to MCn. A gate of the source select transistor SST may be coupled to a source select line SSL. The source select transistor SST may be turned on or turned off in response to the voltage applied to the source select line SSL.

The plurality of memory cells MC1 to MCn may be disposed between the source select transistor SST and the drain select transistor DST. The plurality of memory cells MC1 to MCn may be coupled in series to each other between the source select transistor SST and the drain select transistor DST. Gates of the plurality of memory cells MC1 to MCn may be coupled to respective ones of a plurality of word lines WL1 to WLn. The operations of the memory cells MC1 to MCn may be controlled by voltages applied to corresponding ones of the word lines WL1 to WLn. Memory cells coupled to the same word line may constitute a page, and memory cells may be selected in units of pages at the time of a program or read operation.

The drain select transistor DST may control electrical connection between the plurality of memory cells MC1 to MCn and the bit lines BL1 to BLi. A gate of the drain select transistor DST may be coupled to a drain select line DSL1 or DSL2. The operation of the drain select transistor DST may be controlled based on the voltage applied to the drain select line DSL1 or DSL2.

The first drain select line DSL1 may be coupled to the plurality of first memory cell strings CS1, and the second drain select line DSL2 may be coupled to the plurality of second memory cell strings CS2. Accordingly, one of the pages included in the plurality of first memory cell strings CS1 or the plurality of second memory cell strings CS2 may be selected by selecting one of the plurality of word lines WL1 to WLn and selecting the first drain select line DSL1 or the second drain select line DSL2.

The plurality of first memory cell strings CS1 and the plurality of second memory cell strings CS2 may be coupled in common to the plurality of word lines WL1 to WLn.

The configuration of the first memory block BLK1 may be variously changed, and is not limited to the configuration illustrated in FIG. 3.

Figure 4:
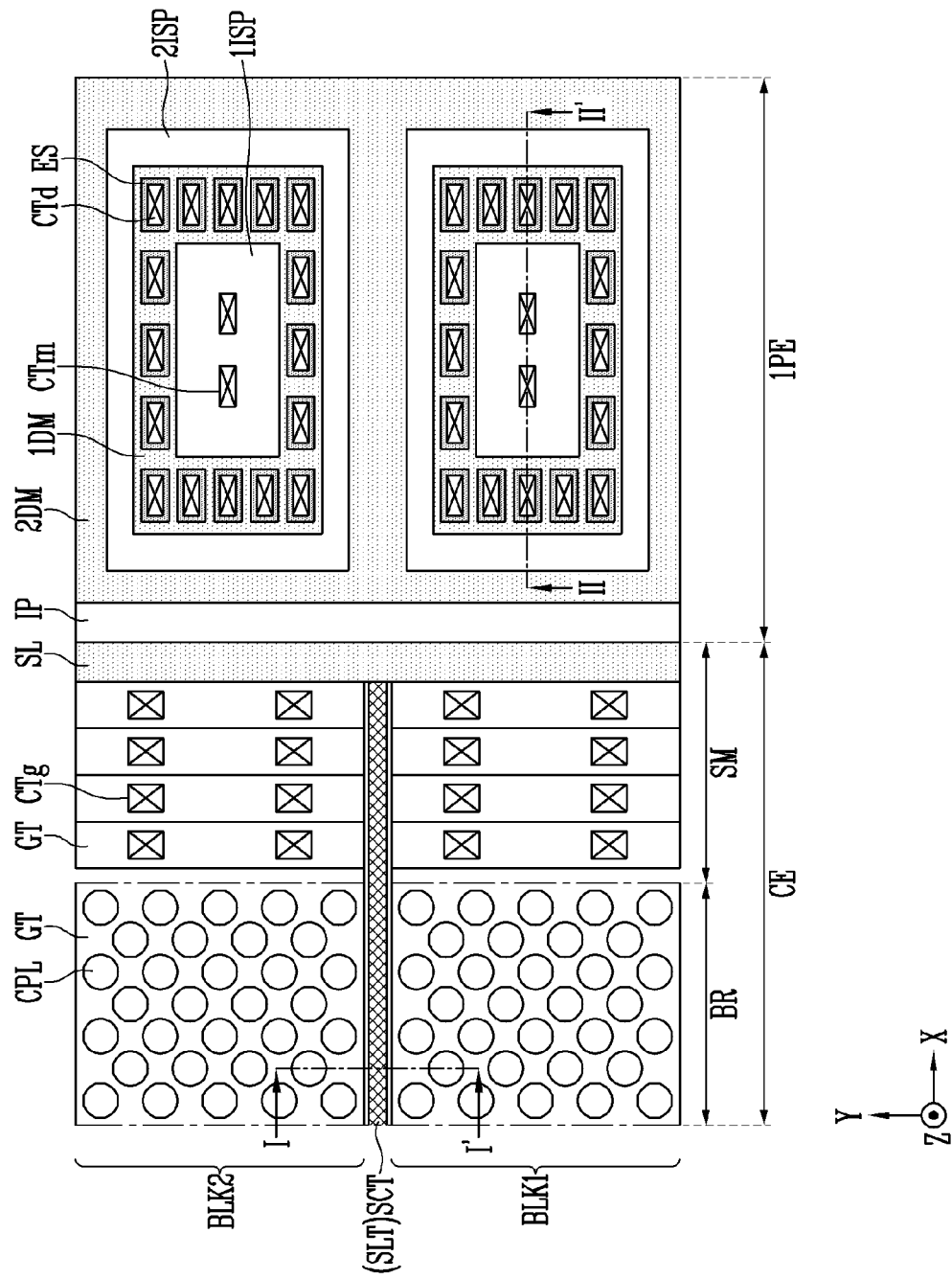
FIG. 4 is a view for explaining the layout of a memory device according to an embodiment of the present disclosure.

FIG. 4 is a view for explaining the layout of a memory device according to an embodiment of the present disclosure.

Referring to FIG. 4, a first peripheral region 1PE may be defined in a region adjacent to a cell region CE in an X direction. A memory block region BR and a slim region SM may be defined in the cell region CE.

The memory block region BR may include a plurality of memory blocks BLK1 and BLK2. The plurality of memory blocks BLK1 and BLK2 may include a plurality of cell plugs CPL passing through stacked gate lines GT. The plurality of memory blocks BLK1 and BLK2 may be disposed to be spaced apart from each other along a Y direction, and the gate lines GT respectively included in the memory blocks BLK1 and BLK2 may extend along the X direction. The cell plugs CPL may be disposed to be spaced apart from each other along the X and Y directions. The plurality of memory blocks BLK1 and BLK2 spaced apart from each other along the Y direction may be separated from each other by a slit SLT. In FIG. 4, portions of the first and second memory blocks BLK1 and BLK2 are illustrated as an example, and the first and second memory blocks BLK1 and BLK2 may be separated from each other by the slit SLT. A source contact SCT may be formed in the slit SLT. The source contact SCT may come into contact with a source line SL formed below (in a –Z direction from) the first and second memory blocks BLK1 and BLK2. An insulating layer for electrically blocking the source contact SCT and the gate lines GT may be formed between the source contact SCT and the first and second memory blocks BLK1 and BLK2.

The slim region SM may include the edge portions of the gate lines GT extending from the memory block region BR. The edge portions of the stacked gate lines GT may be stacked in the shape of stairs, and gate contacts CTg configured to transmit different voltages to the gate lines GT may be formed in the edge portions of the gate lines GT. A portion of the source line SL may be exposed below the gate lines GT.

The first peripheral region 1PE may include main contacts CTm and dummy contacts CTd. The main contacts CTm may be formed simultaneously with discharge contacts (not illustrated) for emitting charges capable of being generated in conductive layers in the process of manufacturing a memory device. For example, peripheral circuits configured to transfer different voltages at the time of a program, a read, or an erase operation of memory cells may be formed in the first peripheral region 1PE. The words "simultaneous" and "simultaneously" as used herein with respect to processes mean that the processes take place on overlapping intervals of time. For example, if a first process takes place over a first interval of time and a second process takes place simultaneously over a second interval of time, then the first and second intervals at least partially overlap each other such that there exists a time at which the first and second processes are both taking place.

For example, the main contacts CTm may be formed over the peripheral circuits formed in the first peripheral region 1PE. The dummy contacts CTd may be formed in order to facilitate an etching process performed in the region in which main contacts CTm are to be formed. For example, the dummy contacts CTd may be formed in order to prevent a phenomenon in which contact holes formed in the region in which main contacts CTm are to be formed are etched deeper or shallower than a target depth. For example, the dummy contacts CTd are formed in a region adjacent to the main contacts CTm, but do not come into contact therewith. Accordingly, the main contacts CTm may be formed in a first insulating pattern 1ISP, and the dummy contacts CTd may be formed in a first dummy pattern 1DM enclosing the first insulating pattern 1ISP. The first dummy pattern 1DM may be enclosed by a second insulating pattern 2ISP, and the second insulating pattern 2ISP may be enclosed by a second dummy pattern 2DM.

Unlike the main contacts CTm, the dummy contacts CTd are not coupled to the peripheral circuits because they do not function as actual contacts. That is, the dummy contacts CTd are formed only in the first dummy pattern 1DM.

Accordingly, in the present embodiment, etching stop patterns ES are formed in the first dummy pattern 1DM in order to prevent the dummy contacts CTd from being formed deeper than a target depth. The etching stop patterns ES may be formed simultaneously with an etching stop pattern for preventing overetching of the slit SLT.

Because the etching stop patterns ES are formed simultaneously with the etching stop pattern in the cell region CE, a detailed structure will be described below with reference to the cross section taken along line I-I' of the cell region CE and the cross section taken along line II-II' of the first peripheral region 1PE.

Figure 5:
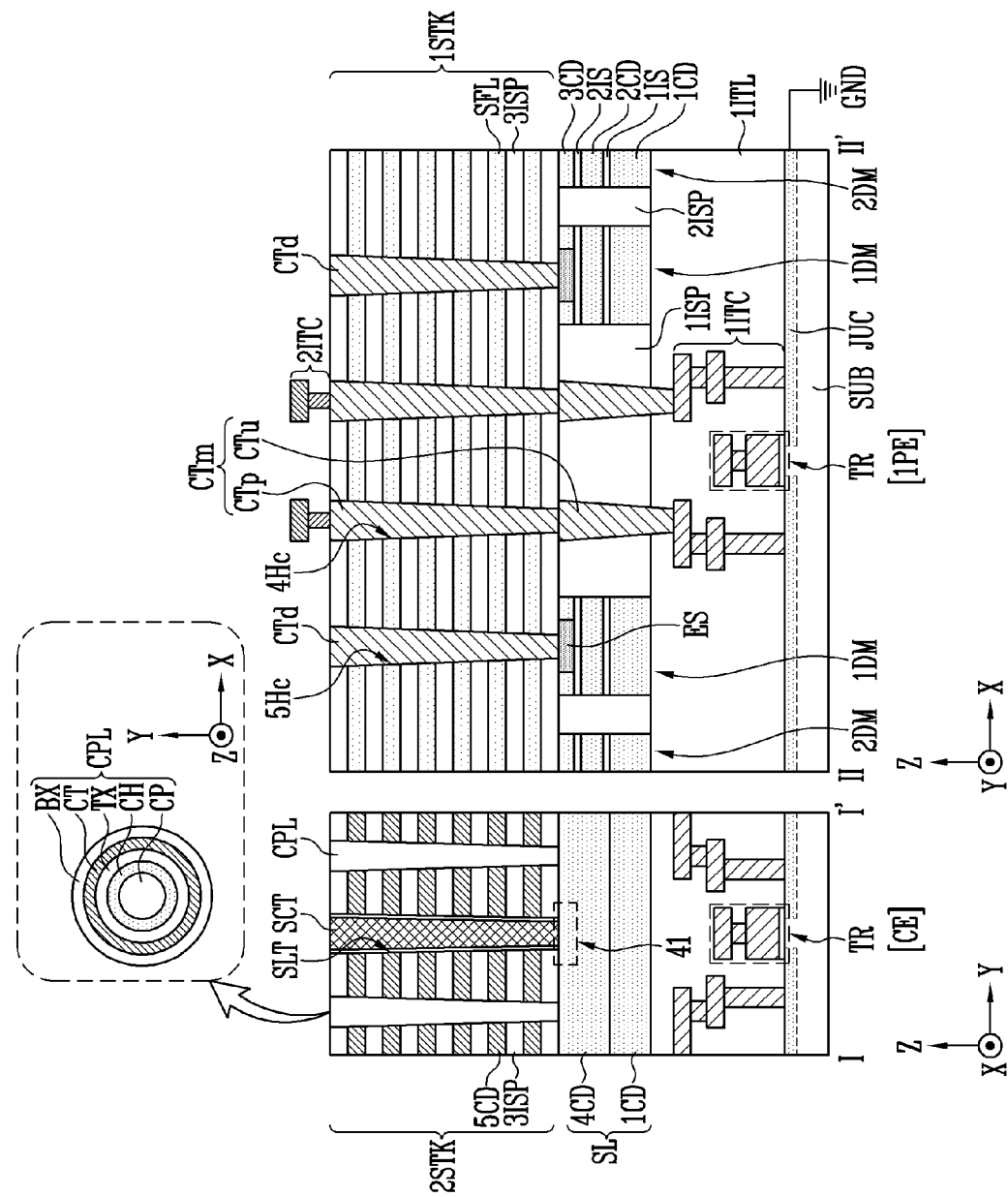
FIG. 5 is a view for explaining the final structure of a memory device according to an embodiment of the present disclosure.

FIG. 5 is a view for explaining the final structure of a memory device according to an embodiment of the present disclosure.

Referring to FIG. 5, the cross section taken long the line I-I' shows a partial structure of a cell region CE, and the cross section taken along line II-II' shows a partial structure of a first peripheral region 1PE.

Junction regions JUC to which a voltage can be transferred may be formed in the substrate SUB of the cell region CE and the first peripheral region 1PE.

A first interlayer insulting layer 1ITL may be formed on the substrate SUB of the cell region CE and the first peripheral region 1PE, and a plurality of transistors TR included in a peripheral circuit and first connection structures 1ITC coupled to the junction region JUC of the transistors TR may be formed in the first interlayer insulting layer 1ITL. For example, the first connection structures 1ITC may be configured with a plurality of contacts and lines. The first interlayer insulating layer 1ITL may be formed of an oxide or a silicon oxide. A portion of the junction region JUC formed in the first peripheral region 1PE may be coupled to a ground terminal GND or to other transistors.

In the cell region CE, a source line SL may be formed over the first interlayer insulating layer 1ITL, and in the first peripheral region 1PE, first to third conductive layers 1CD to 3CD and first and second insulating layers 1IS and 2IS may be formed over the first interlayer insulating layer 1ITL. The source line SL formed in the cell region CE may include first and fourth conductive layers 1CD and 4CD. The first and fourth conductive layers 1CD and 4CD formed in the cell region CE may be used as the source line SL coupled to a memory block. The first to third conductive layers 1CD to 3CD formed in the first peripheral region 1PE may be a dummy structure that remains when a process for forming the source line SL of the cell region is performed. The first to fourth conductive layers 1CD to 4CD may be formed as conductive layers. For example, the first to fourth conductive layers 1CD to 4CD may be formed as the same conductive layer or different conductive layers. For example, each of the first to fourth conductive layers 1CD to 4CD may be formed as a doped polysilicon layer or a metal layer. The first or second insulating layer 1IS or 2IS may be formed between the first to third conductive layers 1CD to 3CD remaining in the first peripheral region 1PE. The first and second insulating layers 1IS and 2IS may be formed of an oxide layer or a silicon oxide layer.

Portions of the first to third conductive layers 1CD to 3CD and the first and second insulating layers 1IS and 2IS remaining in the first peripheral region 1PE may be used as a first dummy pattern 1DM, and other portions thereof may be used as a second dummy pattern 2DM. A first insulating pattern 1ISP may be formed on the inward side of the first dummy pattern 1DM, and a second insulating pattern 2ISP may be formed between the first and second dummy patterns 1DM and 2DM. Lower contacts CTu vertically passing through the first insulating pattern 1ISP may be formed in the first insulating pattern 1ISP. The lower contacts CTu are contacts formed in the lower parts of main contacts CTm, and may come into contact with the first connection structures 1ITC formed in the first peripheral region 1PE.

Etching stop patterns ES may be formed in the third conductive layer 3CD formed in the upper part of the first dummy pattern 1DM. The etching stop patterns ES remaining in the first peripheral region 1PE may be formed in order to prevent an etching process for forming fourth holes 4Hc over the lower contacts CTu from being excessively performed. For example, when an etching process for forming fourth holes 4Hc over the lower contacts CTu is performed, fifth holes 5Hc may be formed over the first dummy pattern 1DM simultaneously therewith. The etching stop patterns ES remaining in the first peripheral region 1PE are formed simultaneously with an etching stop pattern 41 in the cell region CE, but the etching stop pattern 41 formed in the cell region CE may be removed in a subsequent process.

A first stacked structure 1STK, along with upper contacts CTp and dummy contacts CTd vertically passing through the first stacked structure 1STK, may be formed over the first and second dummy patterns 1DM and 2DM and the first and second insulating patterns 1ISP and 2ISP in the first peripheral region 1PE. The first stacked structure 1STK may include alternately stacked third insulating patterns 3ISP and sacrificial patterns SFL. The third insulating patterns 3ISP may be formed of an oxide or a silicon oxide, and the sacrificial patterns SFL may be formed of a material having an etch selectivity different from that of the third insulating patterns 3ISP. For example, the sacrificial patterns SFL may be formed of a nitride layer. The upper contacts CTp are contacts formed in the upper region of the main contacts CTm, and may come into contact with the upper part of the lower contacts CTu. That is, each of the main contacts CTm may be configured with an upper contact CTp and a lower contact CTu. The upper contacts CTp and the dummy contacts CTd may be formed in the fourth and fifth holes 4Hc and 5Hc vertically passing through the first stacked structure 1STK. The etching stop patterns ES may be used to stop an etching process at an appropriate time when the etching process for forming the fourth holes 4Hc is performed. Because the upper contacts CTp and the dummy contacts CTd are simultaneously formed in the fourth and fifth holes 4Hc and 5Hc, they may be formed of the same conductive material. For example, the dummy contacts CTd, the upper contacts CTp, and the lower contacts CTu may be formed of the same conductive material.

Second connection structures 2ITC may be formed over the upper contacts CTp. The second connection structures 2ITC may be formed of a conductive material. The second connection structures 2ITC may be coupled to lines or gate lines extending from the cell region CE.

A second stacked structure 2STK, along with cell plugs CPL and a source contact SCT passing through the second stacked structure 2STK in a vertical direction, may be formed over the source line SL in the cell region CE. The second stacked structure 2STK may include alternately stacked third insulating patterns 3ISP and fifth conductive layers 5CD. The third insulating patterns 3ISP may be formed of an oxide layer or a silicon oxide layer. The fifth conductive layers 5CD are used as a gate line (GT in FIG. 4), and may be formed of a metal material, such as tungsten (W), molybdenum (Mo), cobalt (Co), nickel (Ni), or the like, or a semiconductor material, such as silicon (Si) or polysilicon (Poly-Si), but are not limited thereto. In an embodiment, the vertical direction may be the Z direction.

The cell plugs CPL may include material layers constituting a memory cell. For example, each of the cell plugs CPL may include a core pillar CP, a channel layer CH, a tunnel isolation layer TX, a charge trap layer CT, and a blocking layer BX. The core pillar CP may be formed in a circular column shape in the center of the cell plug CPL, and may be formed of an insulating material. The channel layer CH may be formed in the shape of a cylinder enclosing the side surface of the core pillar CP, and may be formed of a polysilicon layer. The tunnel isolation layer TX may be formed in the shape of a cylinder enclosing the side surface of the channel layer CH, and may be formed of an oxide layer or a silicon oxide layer. The charge trap layer CT may be formed in the shape of a cylinder enclosing the side surface of the tunnel isolation layer TX, and may be formed of a nitride layer capable of trapping charges. The blocking layer BX may be formed in the shape of a cylinder enclosing the side surface of the charge trap layer CT, and may be formed of an oxide layer or a silicon oxide layer.

The method of manufacturing a memory device for forming the above-described structure will be described in detail below.

Figure 6A:
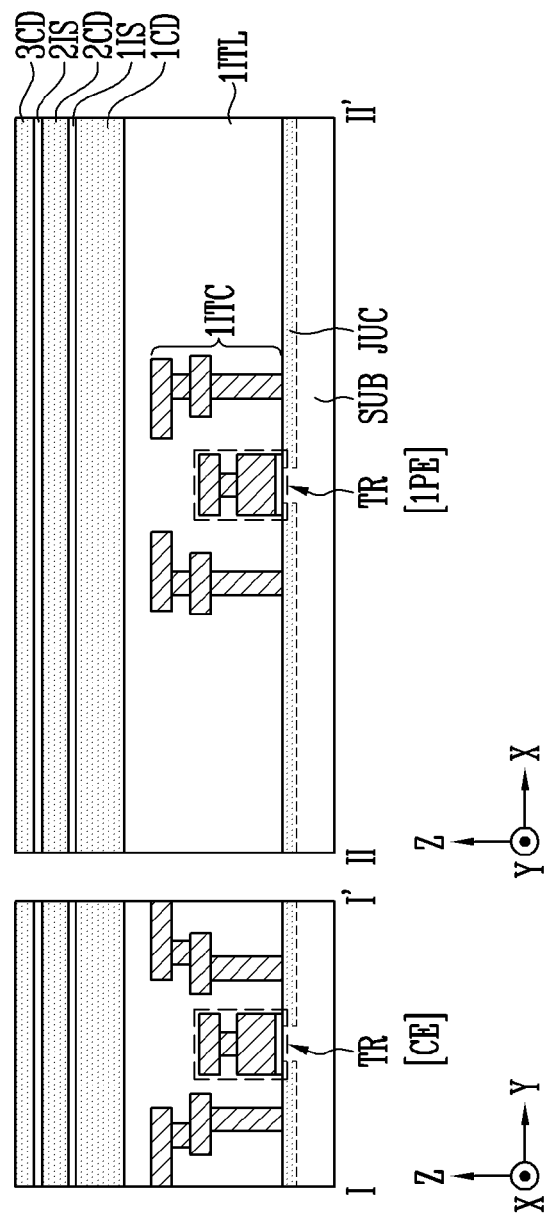
Figure 6B:
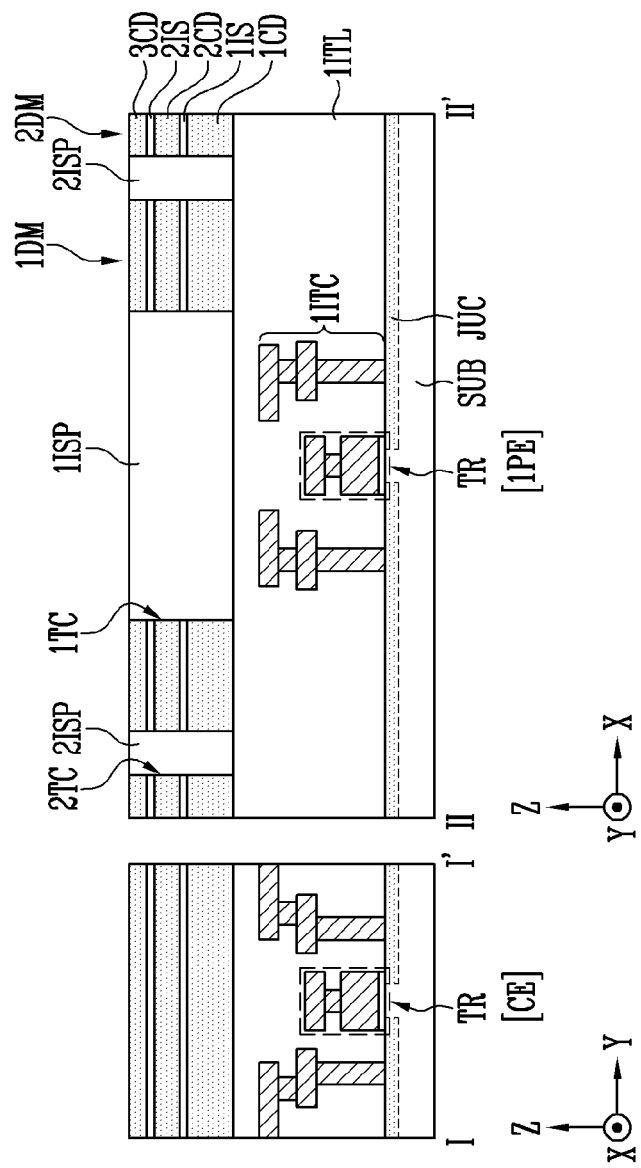
Figure 6C:
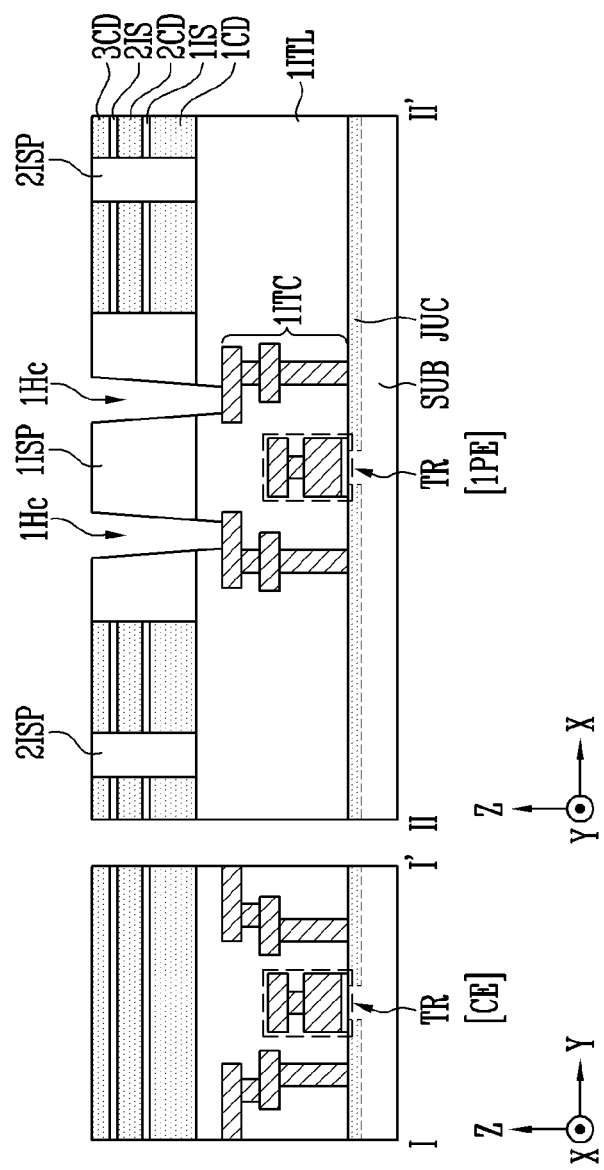
Figure 6D:
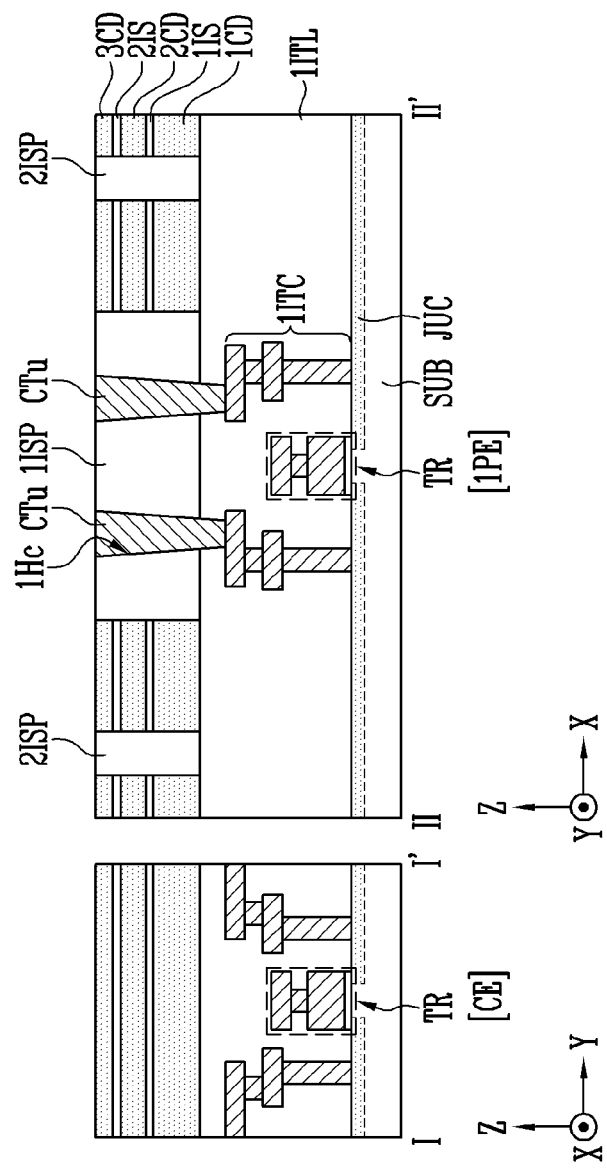
Figure 6E:
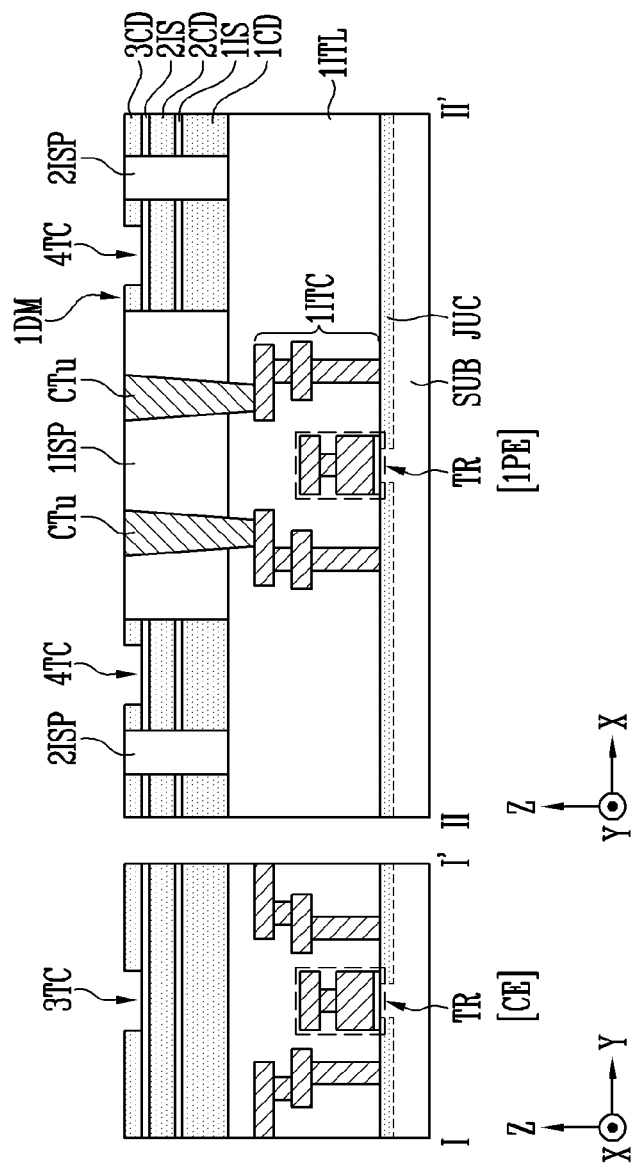
Figure 6F:
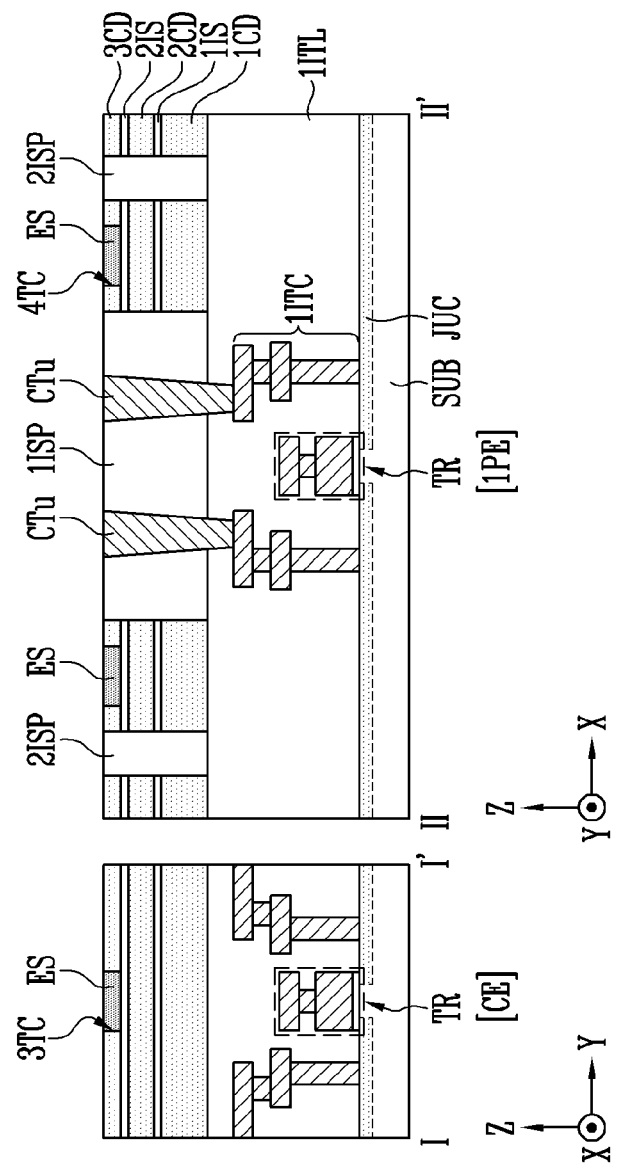
Figure 6G:
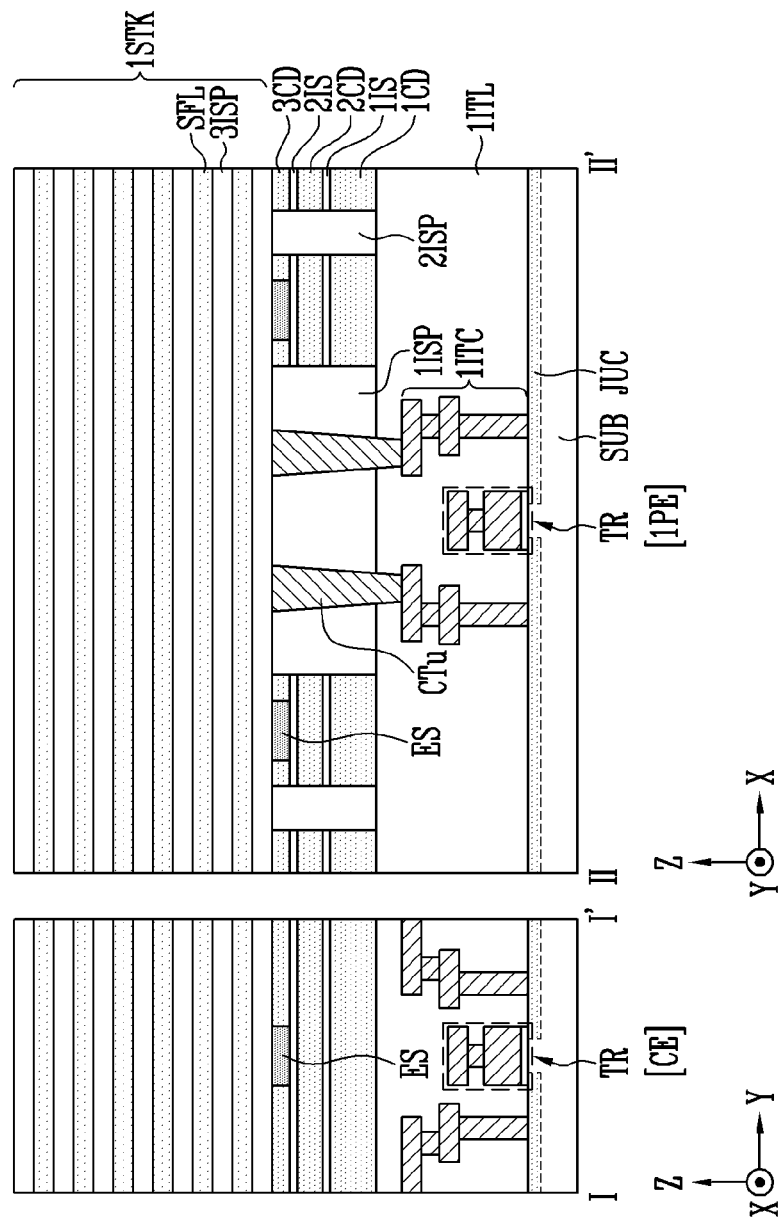
Figure 6H:
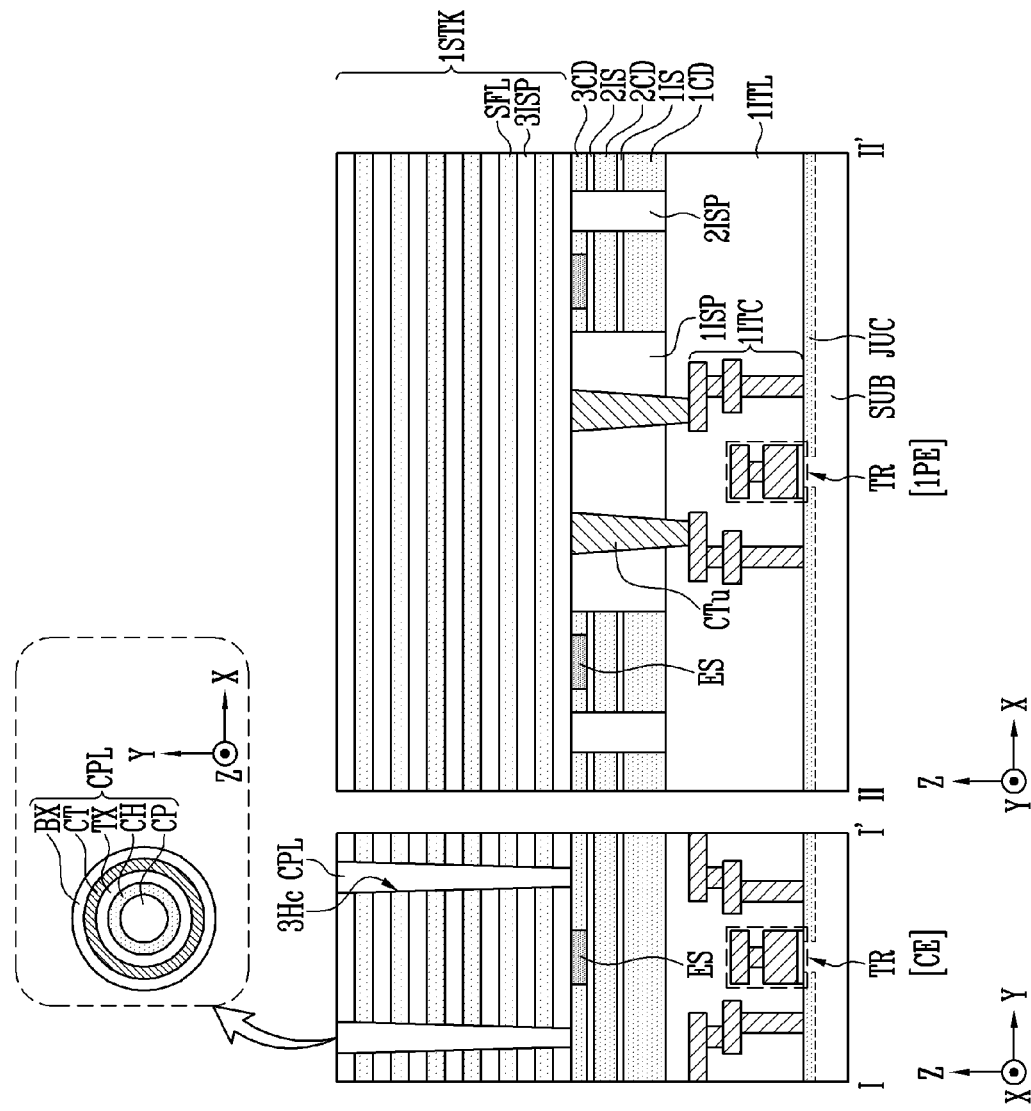
Figure 6I:
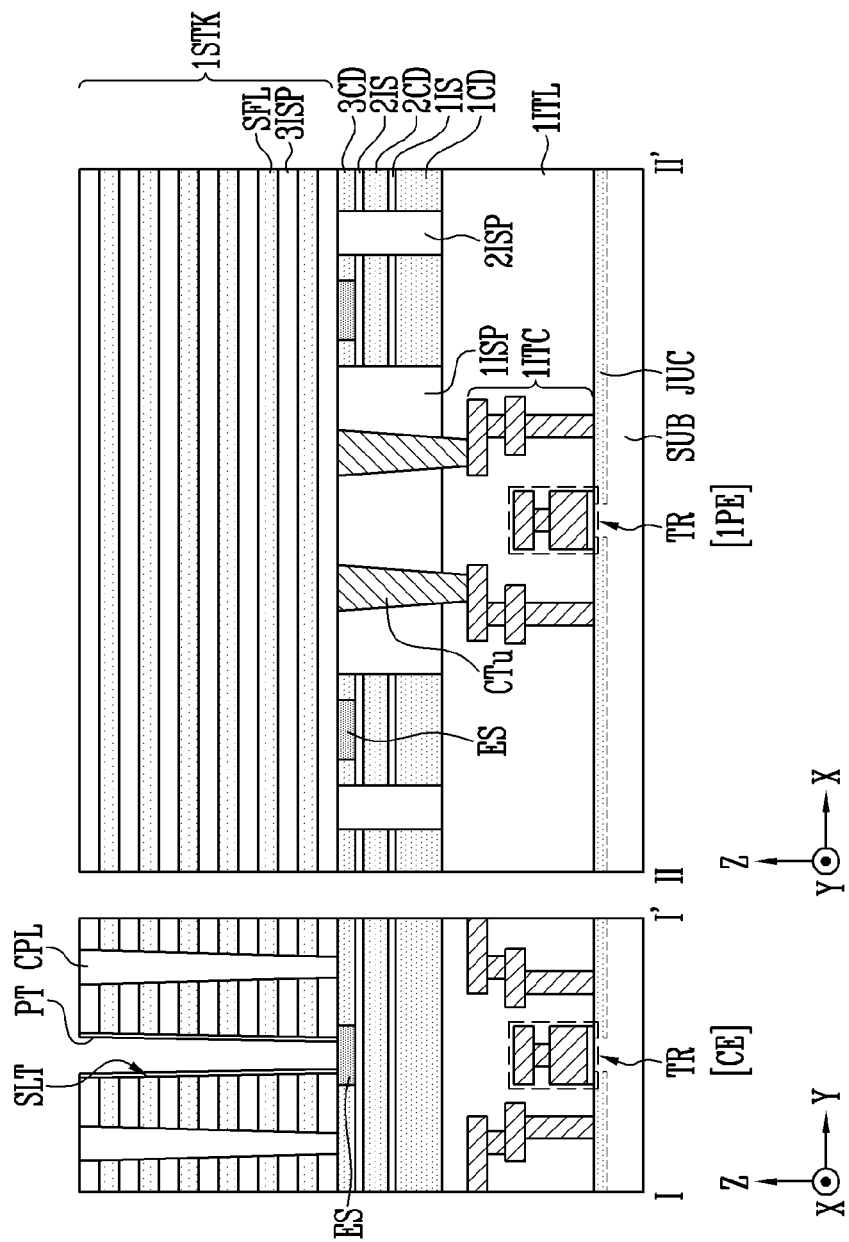
Figure 6J:
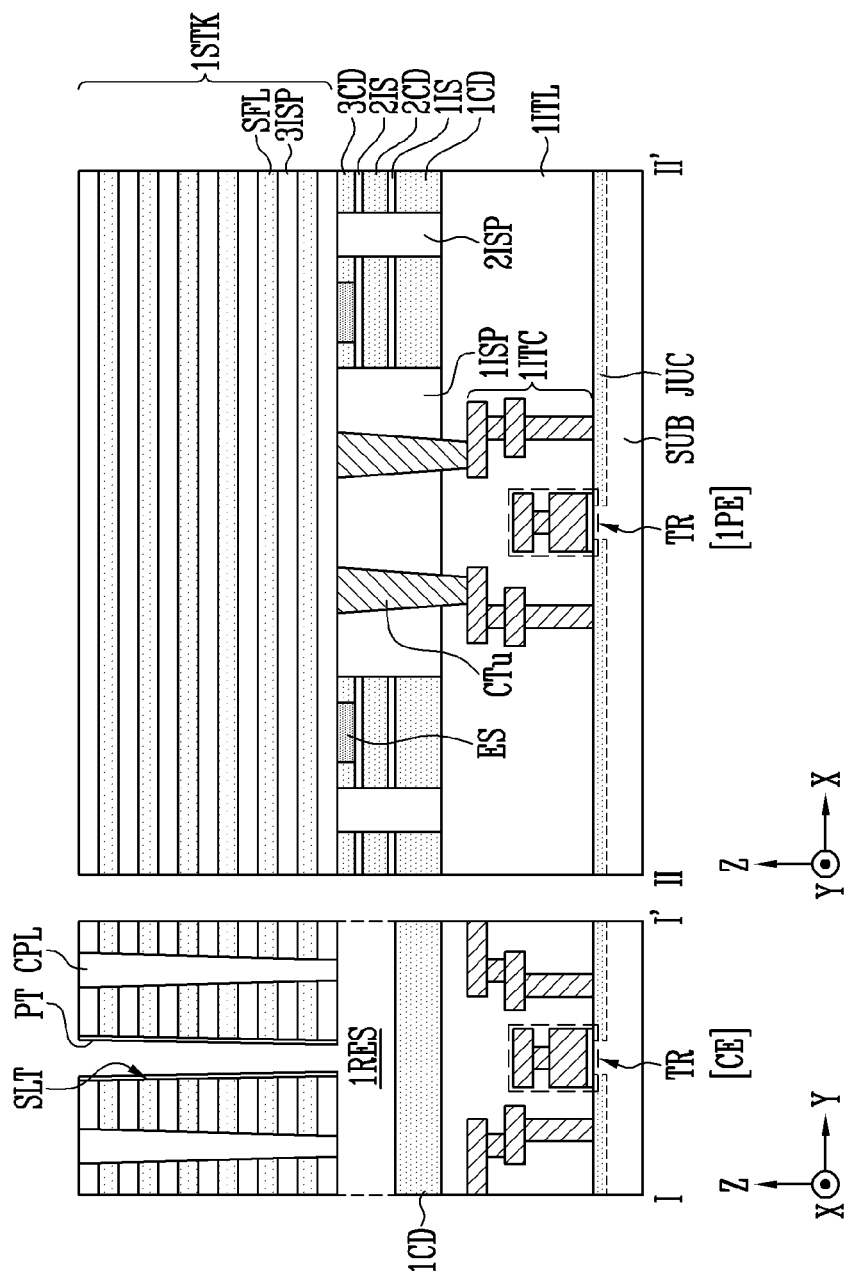
Figure 6K:
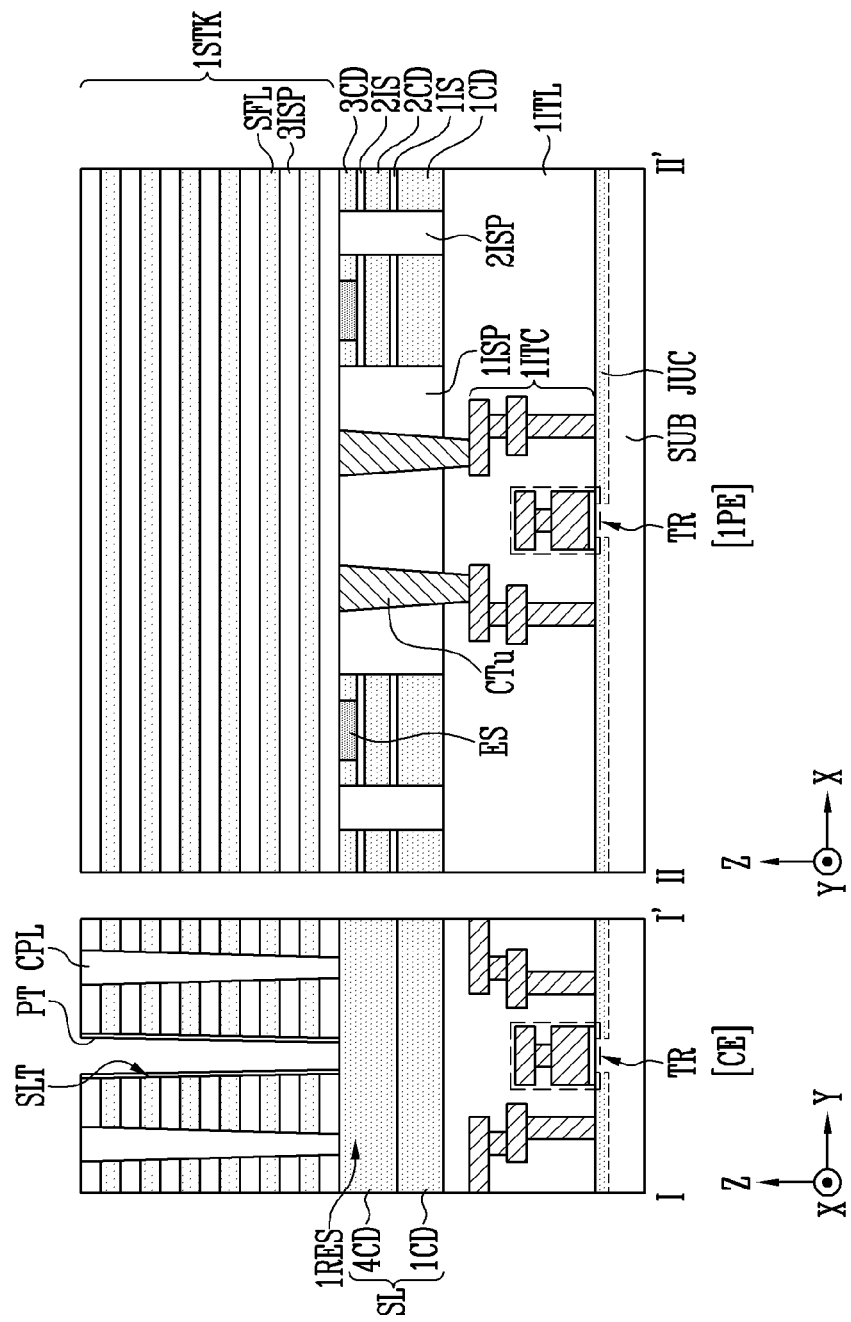
Figure 6L:
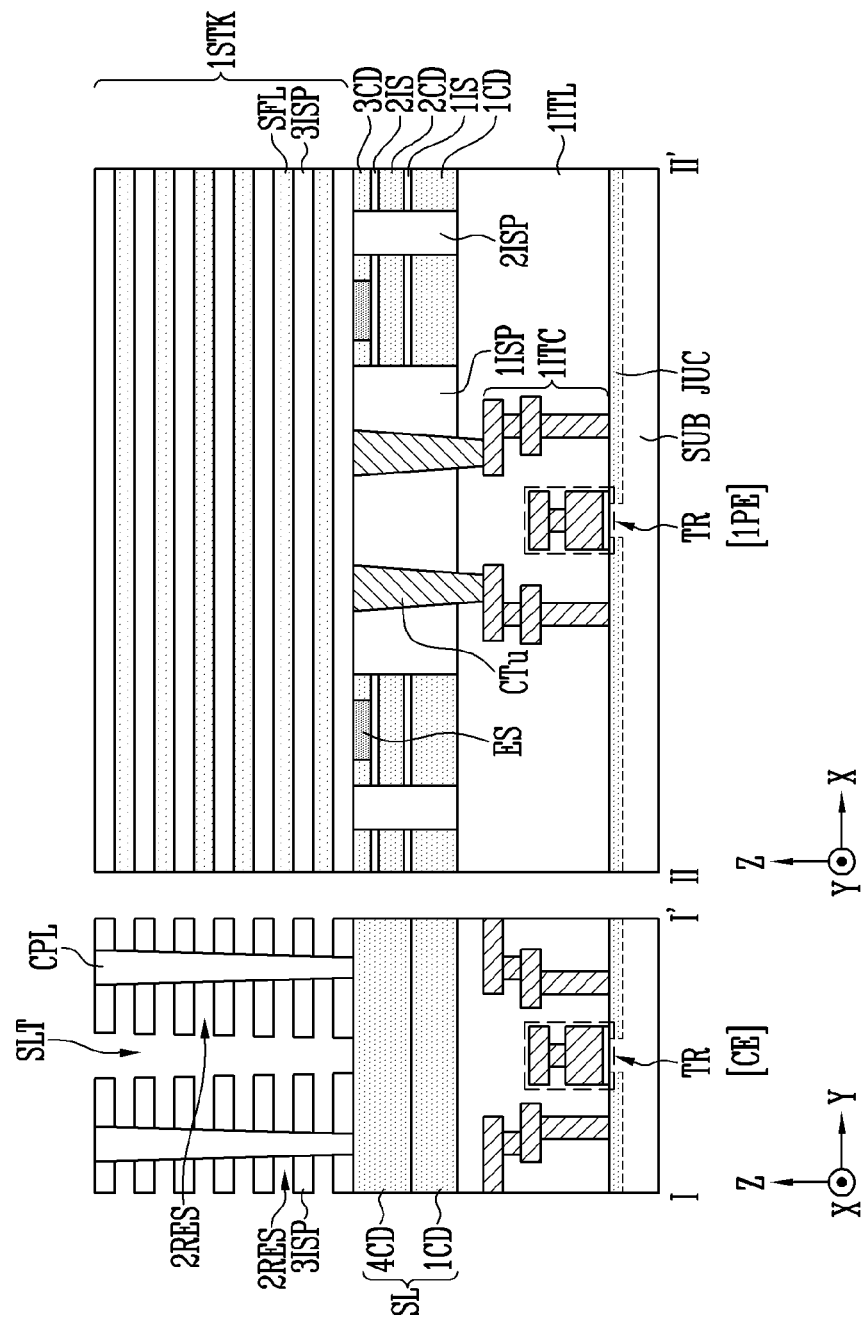
Figure 6M:
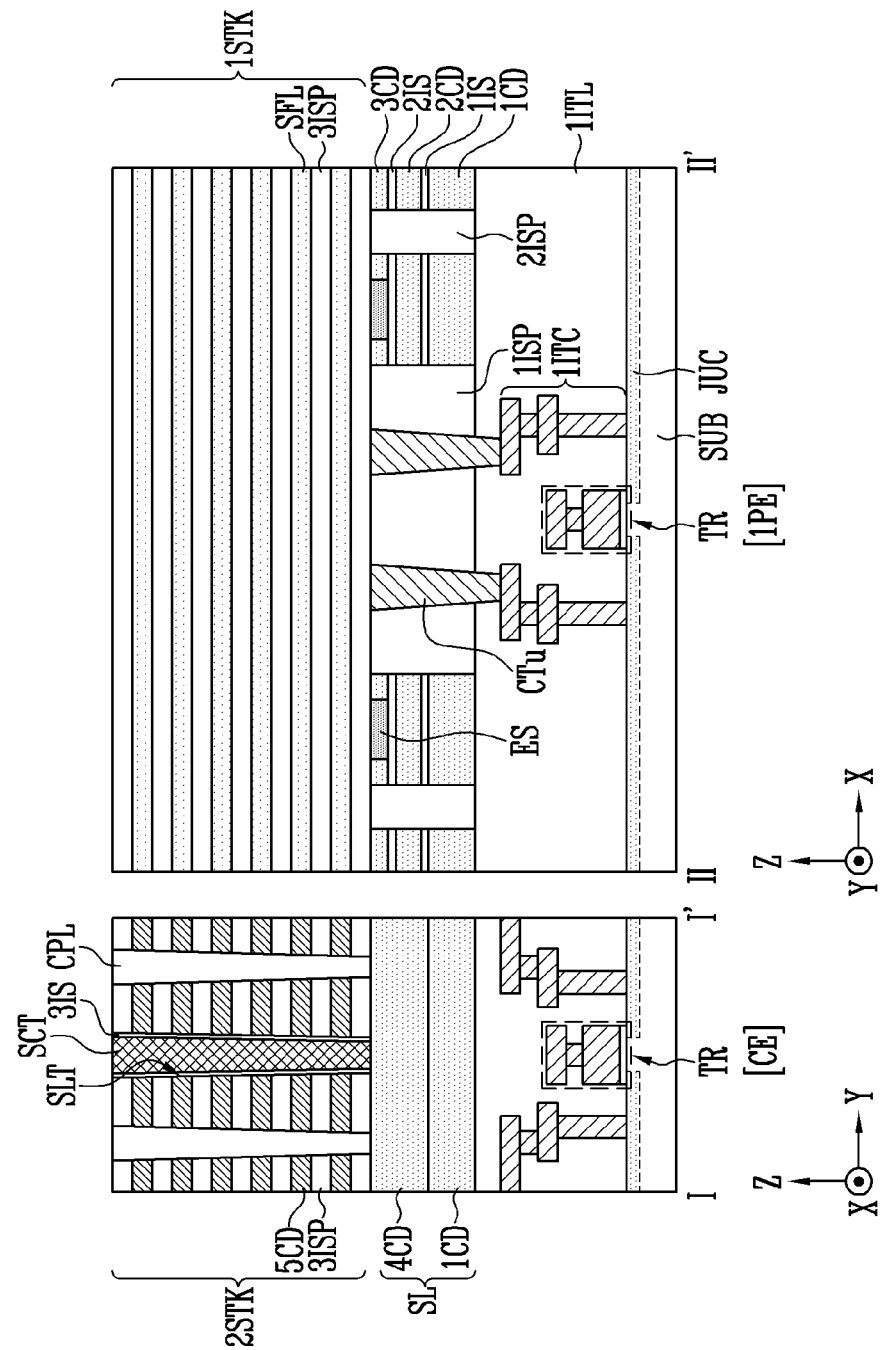
Figure 6N:
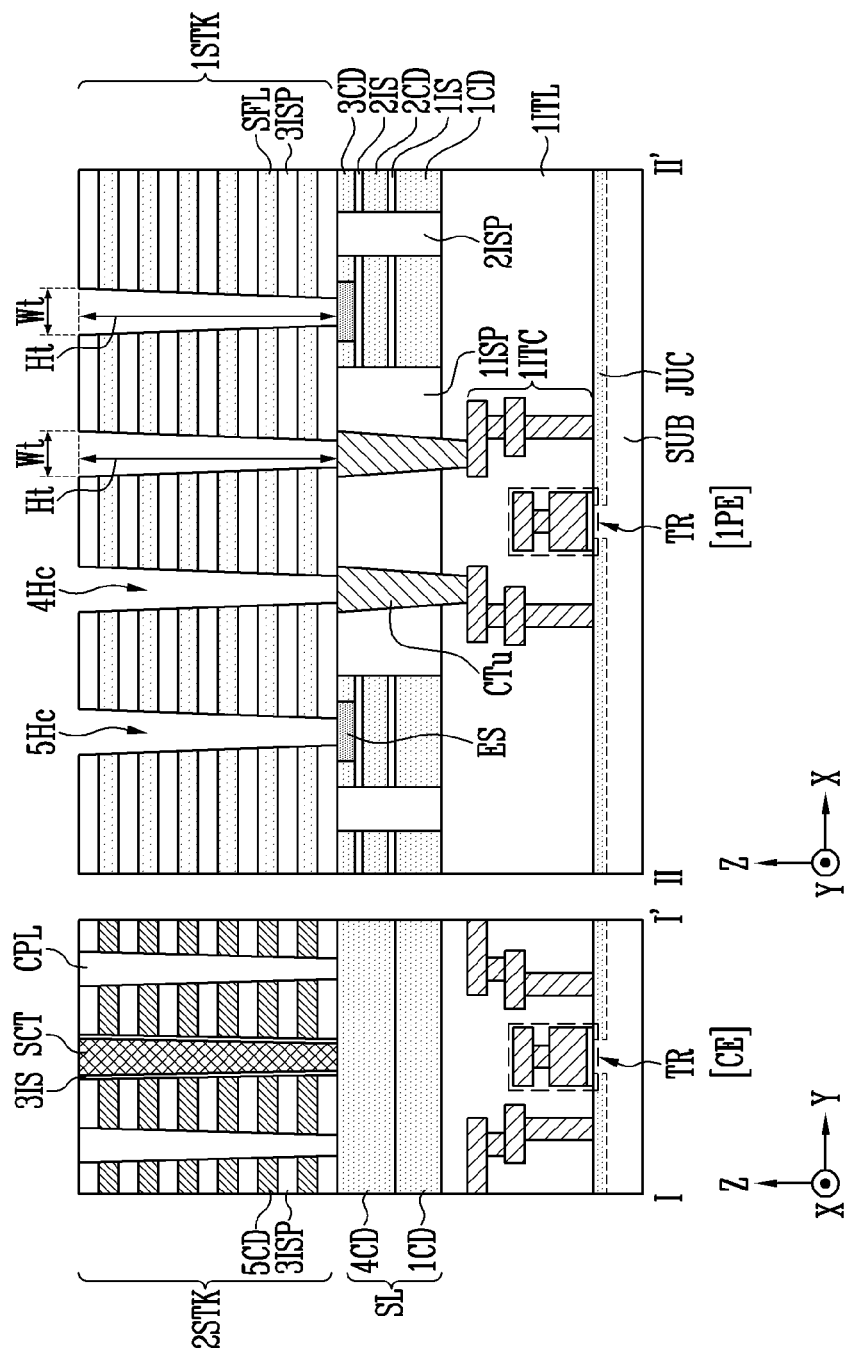
Figure 60:
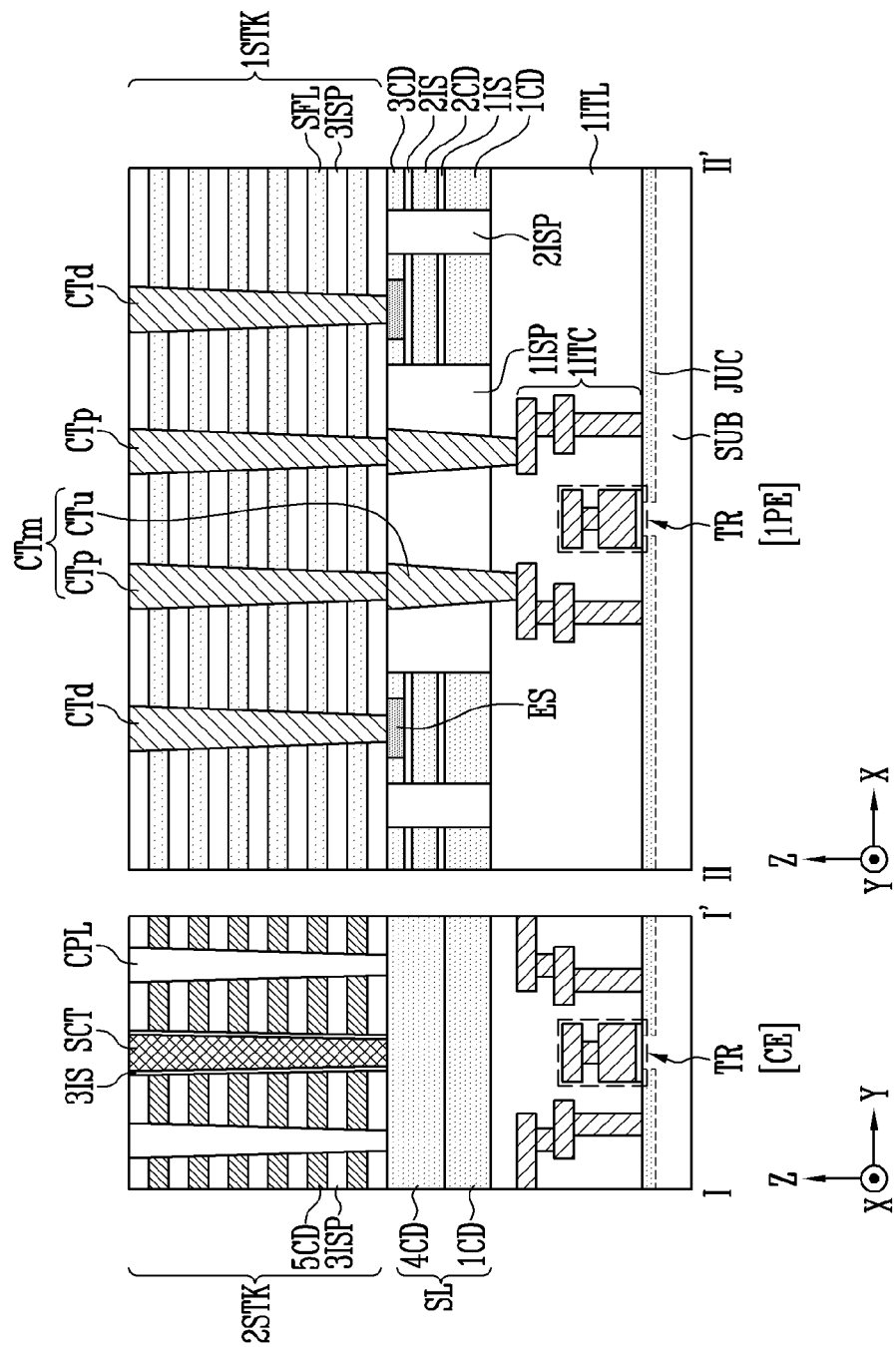
Figure 6P:
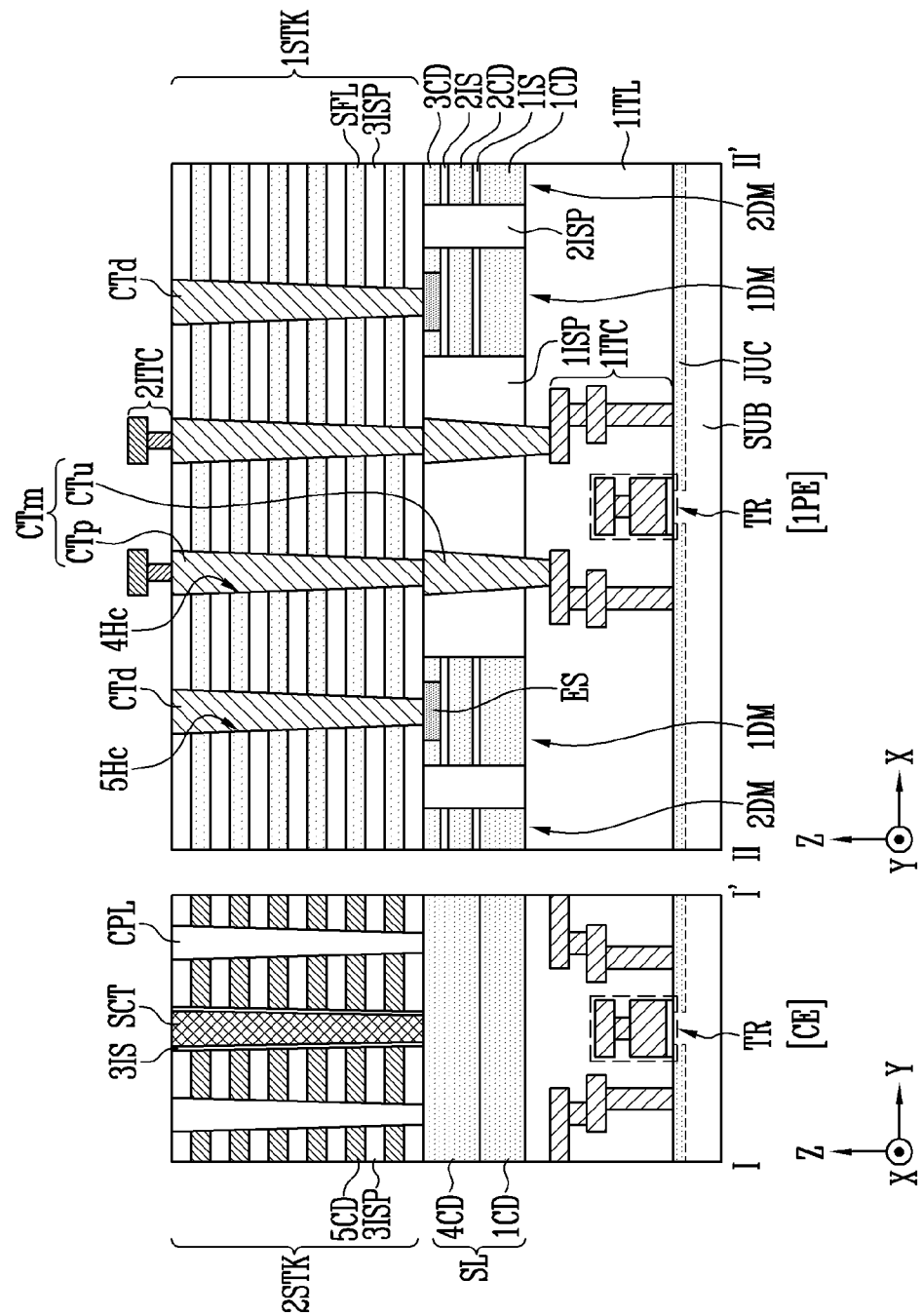

FIGS. 6A to 6P are views for explaining a method of manufacturing a memory device according to the present disclosure.

Referring to FIG. 6A, a first interlayer insulating layer 1ITL may be formed on a substrate SUB in a cell region CE and a first peripheral region 1PE, and a plurality of transistors TR included in a peripheral circuit and first connection structures 1ITC coupled to the junction region JUC of the transistors TR may be formed in the first interlayer insulating layer 1ITL. For example, the first connection structures 1ITC may be configured with a plurality of contacts and lines. The first interlayer insulating layer 1ITL may be formed of an oxide or a silicon oxide.

First to third conductive layers 1CD to 3CD and first and second insulating layers 1IS and 2IS may be formed over the first interlayer insulating layer 1ITL. For example, the first insulating layer 1IS may be formed between the first and second conductive layers 1CD and 2CD, and the second insulating layer 2IS may be formed between the second and third conductive layers 2CD and 3CD. The first to third conductive layers 1CD to 3CD may be formed as the same conductive layer or different conductive layers. For example, the first to third conductive layers 1CD to 3CD may be formed of a doped polysilicon layer or a metal layer. The first and second insulating layers 1IS and 2IS may be formed of an oxide layer or a silicon oxide layer.

Referring to FIG. 6B, a first dummy pattern 1DM and a second dummy pattern 2DM may be formed by patterning the first to third conductive layers 1CD to 3CD and the first and second insulating layers 1IS and 2IS in the first peripheral region 1PE. Specifically describing this, first and second trenches 1TC and 2TC spaced apart from each other may be formed by etching portions of the first to third conductive layers 1CD to 3CD and the first and second insulating layers 1IS and 2IS in the first peripheral region 1PE. The first trench 1TC may be formed over the first connection structure 1ITC, and the second trench 2TC may be formed in a region spaced apart from the first trench 1TC while enclosing the vicinity of the first trench 1TC. The first to third conductive layers 1CD to 3CD and the first and second insulating layers 1IS and 2IS remaining between the first and second trenches 1TC and 2TC may constitute the first dummy pattern 1DM, and the first to third conductive layers 1CD to 3CD and the first and second insulting layers 1IS and 2IS remaining in the vicinity of the second trench 2TC may constitute the second dummy pattern 2DM. A first insulating pattern 1ISP may be formed in the first trench 1TC, and a second insulating pattern 2ISP may be formed in the second trench 2TC. The first and second insulating patterns 1ISP and 2ISP may be formed of an oxide layer or a silicon oxide layer. Referring to FIG. 5 and FIG. 6B, in the first peripheral region 1PE, the first insulating pattern 1ISP may be formed over the first connection structure 1ITC, and the first dummy pattern 1DM may be formed to enclose the side surface of the first insulating pattern 1ISP. The second insulating pattern 2ISP may be formed to enclose the side surface of the first dummy pattern 1DM, and the second dummy pattern 2DM may be formed to enclose the side surface of the second insulating pattern 2ISP.

Referring to FIG. 6C, first holes 1Hc exposing a portion of the first connection structure 1ITC may be formed by etching a portion of the first insulating pattern 1ISP. For example, the first holes 1Hc may be formed in the first insulating pattern 1ISP by performing an anisotropic dry etching process.

Referring to FIG. 6D, lower contacts CTu may be formed in the first holes 1Hc. For example, a conductive material is formed over the entire structure to fill the first holes 1Hc, and a flattening process may be performed to expose the third conductive layer 3CD. After the flattening process is performed, the conductive material remaining in the first holes 1Hc may constitute the lower contacts CTu.

Referring to FIG. 6E, a third trench 3TC may be formed by etching a portion of the third conductive layer 3CD formed in the cell region CE. The third trench 3TC may be formed in the region in which a slit is to be formed in the cell region. Simultaneously therewith, fourth trenches 4TC may be formed in a portion of the third conductive layer 3CD in the first peripheral region 1PE. For example, the fourth trenches 4TC may be formed by etching a portion of the third conductive layer 3CD included in the first dummy pattern 1DM. Referring to FIG. 4 and FIG. 6E, because the third trench 3TC is formed in the region in which a slit SLT is to be formed, the third trench 3TC may be formed in the shape of a line extending along an X direction, and the fourth trenches 4TC may be formed as holes or to have rectangular shapes spaced apart from each other in the first dummy pattern 1DM.

Referring to FIG. 6F, etching stop patterns ES may be formed in the third and fourth trenches 3TC and 4TC. The etching stop patterns ES may be formed of a conductive material. For example, the etching stop patterns ES may be formed of tungsten (W), titanium (Ti), or titanium nitride (TiN), or may be formed of a mixture of two or more selected therefrom.

Referring to FIG. 6G, a first stacked structure 1STK may be formed on the entire structure of the cell region CE and the first peripheral region 1PE. The first stacked structure 1STK may include alternately stacked third insulating patterns 3ISP and sacrificial patterns SFL. The third insulating patterns 3ISP may be formed of an oxide or a silicon oxide, and the sacrificial patterns SFL may be formed of a material having an etch selectivity different from that of the third insulating patterns 3ISP. For example, the sacrificial patterns SFL may be formed of a nitride layer.

Referring to FIG. 6H, third holes 3Hc may be formed in the first stacked structure 1STK formed in the cell region CE. For example, the third holes 3Hc exposing a portion of the third conductive layer 3CD may be formed by etching a portion of the first stacked structure 1STK formed in the cell region CE.

Referring to FIG. 6H, cell plugs CPL may be formed in the third holes 3Hc. In an embodiment, a third hole 3Hc may be referred to as a vertical hole. The cell plugs CPL may include material layers configuring a memory cell. Each of the cell plugs CPL may include a core pillar CP, a channel layer CH, a tunnel isolation layer TX, a charge trap layer CT, and a blocking layer BX. For example, the blocking layer BX may be formed in a cylindrical shape along the side surface of the third hole 3Hc, and the charge trap layer CT may be formed in a cylindrical shape along the inner side surface of the blocking layer BX. The tunnel isolation layer TX may be formed in a cylindrical shape along the inner side surface of the charge trap layer CT, and the channel layer CH may be formed in a cylindrical shape along the inner side surface of the tunnel isolation layer TX. The core pillar CP may be formed in a circular column shape in the region enclosed by the channel layer CH. The blocking layer BX, the tunnel isolation layer TX, and the core pillar CP may be formed of an oxide layer or a silicon oxide layer. The charge trap layer CT may be formed of a nitride layer capable of trapping charges. The channel layer CH may be formed of a polysilicon layer.

Referring to FIG. 6I, a slit SLT may be formed between the cell plugs CPL to expose the etching stop pattern ES in the cell region CE. The slit SLT is a kind of trench for separating memory blocks from each other, and may be formed by etching the first stacked structure 1STK formed in the cell region CE using a dry etching process. The etching process for forming the slit SLT may be performed until the etching stop pattern ES is exposed. Through the side of the slit SLT formed in the cell region CE, portions of the third insulating patterns 3ISP and the sacrificial patterns SPL included in the first stacked structure 1STK are exposed. In order to prevent the third insulating patterns 3ISP and the sacrificial patterns SPL exposed through the slit SLT from being damaged in a following process, a protective layer PT may be formed on the side surface of the slit SLT. The material forming the protective layer PT may vary depending on which layer is exposed through the bottom of the slit SLT. For example, the third conductive layer 3CD, the second insulating layer 2IS, the second conductive layer 2CD, the first insulating layer 1IS, and the first conductive layer 1CD are formed below the slit SLT, and among them, the third conductive layer 3CD, the second insulating layer 2IS, the second conductive layer 2CD, and the first insulating layer 1IS may be removed in a subsequent process. Accordingly, the protective layer PT may be formed of a material having different etch selectivity from those of the third conductive layer 3CD, the second insulating layer 2IS, the second conductive layer 2CD, and the first insulating layer 1IS. For example, the protective layer PT may include an oxide layer, a nitride layer, and an oxide layer sequentially formed on the sidewall of the slit SLT.

Referring to FIG. 6J, an etching process for removing the etching stop pattern ES, the third conductive layer 3CD, the second insulating layer 2IS, the second conductive layer 2CD, and the first insulating layer 1IS, which are exposed through the bottom of the slit SLT, may be performed. For example, the third conductive layer 3CD exposed through the bottom of the slit SLT may be removed. When the third conductive layer 3CD is removed, because the second insulating layer 2IS is exposed through the bottom of the slit SLT, the second insulating layer 2IS may be removed after the third conductive layer 3CD is removed. In this way, the second conductive layer 2CD and the first insulating layer 1IS may be sequentially removed. When the third conductive layer 3CD, the second insulating layer 2IS, the second conductive layer 2CD, and the first insulating layer 1IS are removed, a first recess 1RES, which is an empty space, may be formed between the first conductive layer 1CD and the first stacked structure 1STK in the cell region CE.

Referring to FIG. 6K, a fourth conductive layer 4CD may fill the first recess 1RES. The fourth conductive layer 4CD may be formed of the same material as the first conductive layer 1CD. For example, the fourth conductive layer 4CD may be formed of a doped polysilicon layer or a metal layer. The first and fourth conductive layers 1CD and 4CD formed in the cell region CE may be used as a source line SL coupled to a memory block.

Referring to FIG. 6L, an etching process for removing the protective layer PT formed in the slit SLT may be performed. When the protective layer PT is removed, the third insulating patterns 3ISP and the sacrificial patterns SFL may be exposed through the slit SLT. An etching process for selectively removing the sacrificial patterns SFL, among the exposed third insulating patterns 3ISP and sacrificial patterns SFL, may be performed. When the sacrificial patterns SFL are removed, a second recess 2RES may be formed between the third insulating patterns 3ISP.

Referring to FIG. 6M, fifth conductive layers 5CD may fill the second recess 2RES. The fifth conductive layers 5CD may be used as a drain select line, a source select line, or a word line, and some of them may be used as dummy lines. After the fifth conductive layers 5CD are formed, an etching process for removing the fifth conductive layers 5CD remaining in the slit SLT may be performed. Subsequently, a third insulating layer 3IS is formed along the side surface of the slit SLT, and a source contact SCT may be formed in the slit SLT on which the third insulating layer 3IS is formed. The source contact SCT may be formed of a conductive layer. Because the source contact SCT contacts the fourth conductive layer 4CD formed below the slit SLT, the voltage supplied to the source contact SCT may be transferred to the source line SL. The third insulating layer 3IS may be formed of an oxide layer or a silicon oxide layer in order to electrically block the source contact SCT and the fifth conductive layers 5CD from each other.

Referring to FIG. 6N, an etching process for forming fourth holes 4Hc that expose the lower contacts CTu in the first peripheral region 1PE may be performed. The etching process may be performed as an anisotropic dry etching process. Here, simultaneously therewith, fifth holes 5Hc may be formed over the etching stop patterns ES in order to prevent the etching process for forming the fourth holes 4Hc from being excessively or inadequately performed. For example, the etching process for simultaneously forming the fourth and fifth holes 4Hc and 5Hc may be performed until the etching stop patterns ES are exposed through the fifth holes 5Hc. In other words, the etching process for forming the fourth and fifth holes 4Hc and 5Hc may be stopped when the etching stop patterns ES are exposed. Accordingly, a defect in the manufacturing process by which the top surfaces of the lower contacts CTu exposed through the fourth holes 4Hc are excessively damaged or by which the lower contacts CTu are not exposed through the fourth holes 4Hc may be prevented. Because the etching processes for forming the fourth and fifth holes 4Hc and 5Hc are simultaneously started and simultaneously stopped, the depths Ht of the fourth and fifth holes 4Hc and 5Hc may be equal to each other, and the widths Wt thereof may also be equal to each other.

Referring to FIG. 6O, upper contacts CTp and dummy contacts CTd may be simultaneously formed in the fourth and fifth holes 4Hc and 5Hc. For example, the upper contacts CTp may be formed in the fourth holes 4Hc, and the dummy contacts CTd may be formed in the fifth holes 5Hc. Because the upper contacts CTp contacts the lower contacts CTu formed thereunder, the upper contacts CTp and the lower contacts CTu may be electrically connected to the first connection structure 1ITC. Accordingly, main contacts CTm configured with the upper contacts CTp and the lower contacts CTu may be formed. Because the dummy contacts CTd are formed only in the first stacked structure 1STK due to the etching stop patterns ES, they are not used as a structure for transferring a voltage in the first peripheral region 1PE.

Referring to FIG. 6P, second connection structures 2ITC coupled to lines or gate lines extending from the cell region CE may be formed over the main contacts DTm. For example, the second connection structures 2ITC may include contacts and lines formed of a conductive material.

Figure 7:
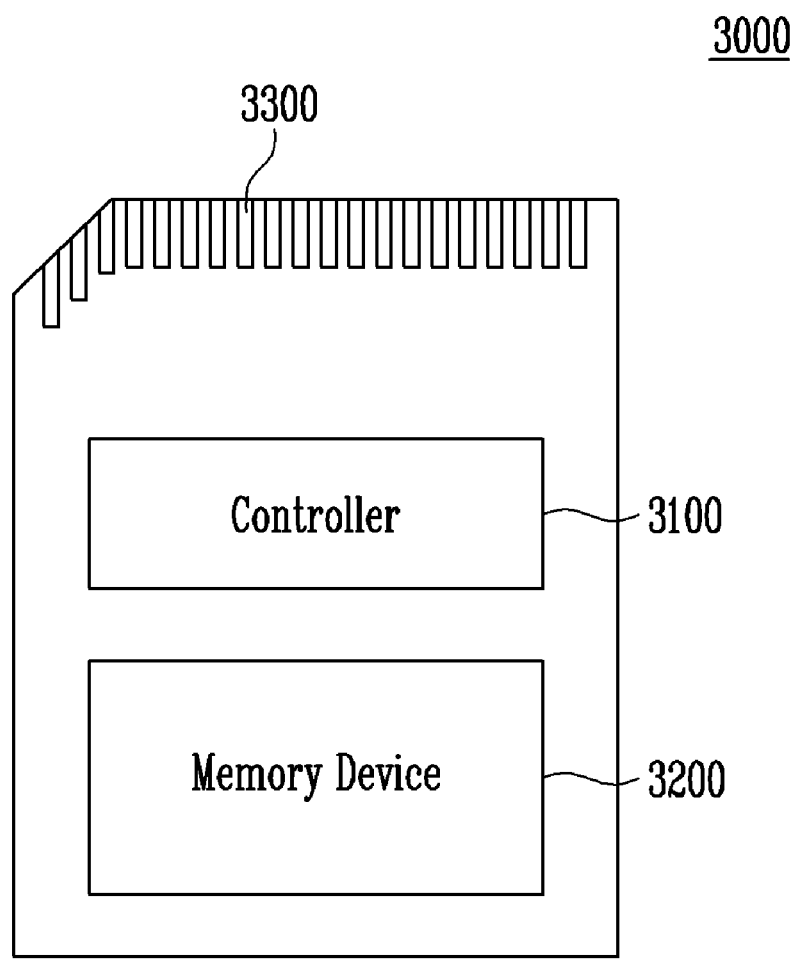
FIG. 7 is a diagram illustrating a memory card system in which a memory device according to an embodiment of the present disclosure is applied.

FIG. 7 is a diagram illustrating a memory card system in which a memory device according to an embodiment of the present disclosure is applied.

Referring to FIG. 7, a memory card system 3000 may include a controller 3100, a memory device 3200, and a connector 3300.

The controller 3100 may be coupled to the memory device 3200. The controller 3100 may access the memory device 3200. For example, the controller 3100 may control a program, a read, or an erase operation of the memory device 3200, or may control a background operation of the memory device 3200. The controller 3100 may provide an interface between the memory device 3200 and a host. The controller 3100 may run firmware for controlling the memory device 3200. In an example, the controller 3100 may include components, such as a random access memory (RAM), a processor, a host interface, a memory interface, and an error correction block.

The controller 3100 may communicate with an external device through the connector 3300. The controller 3100 may communicate with an external device (e.g., a host) based on a specific communication protocol. In an embodiment, the controller 3100 may communicate with the external device through at least one of various communication standards or protocols such as universal serial bus (USB), multimedia card (MMC), embedded MMC (eMMC), peripheral component interconnection (PCI), PCI-express (PCI-E), advanced technology attachment (ATA) protocol, serial-ATA (SATA), parallel-ATA (PATA), small computer system interface (SCSI), enhanced small disk interface (ESDI), integrated drive electronics (IDE), firewire, universal flash storage (UFS), WiFi, Bluetooth, and nonvolatile memory express (NVMe). In an embodiment, the connector 3300 may be defined by at least one of the above-described various communication protocols.

The memory device 3200 may include memory cells, and may be configured in the same manner as the memory device 100 illustrated in FIG. 1.

The controller 3100 and the memory device 3200 may be integrated into a single semiconductor device to form a memory card. For example, the controller 3100 and the memory device 3200 may be integrated into a single semiconductor device, and may then form a memory card such as a personal computer memory card international association (PCMCIA) card, a compact flash card (CF), a smart media card (SM or SMC), a memory stick, a multimedia card (MMC, RS-MMC, MMCmicro or eMMC), an SD card (SD, miniSD, microSD, or SDHC), or a universal flash storage (UFS).

Figure 8:
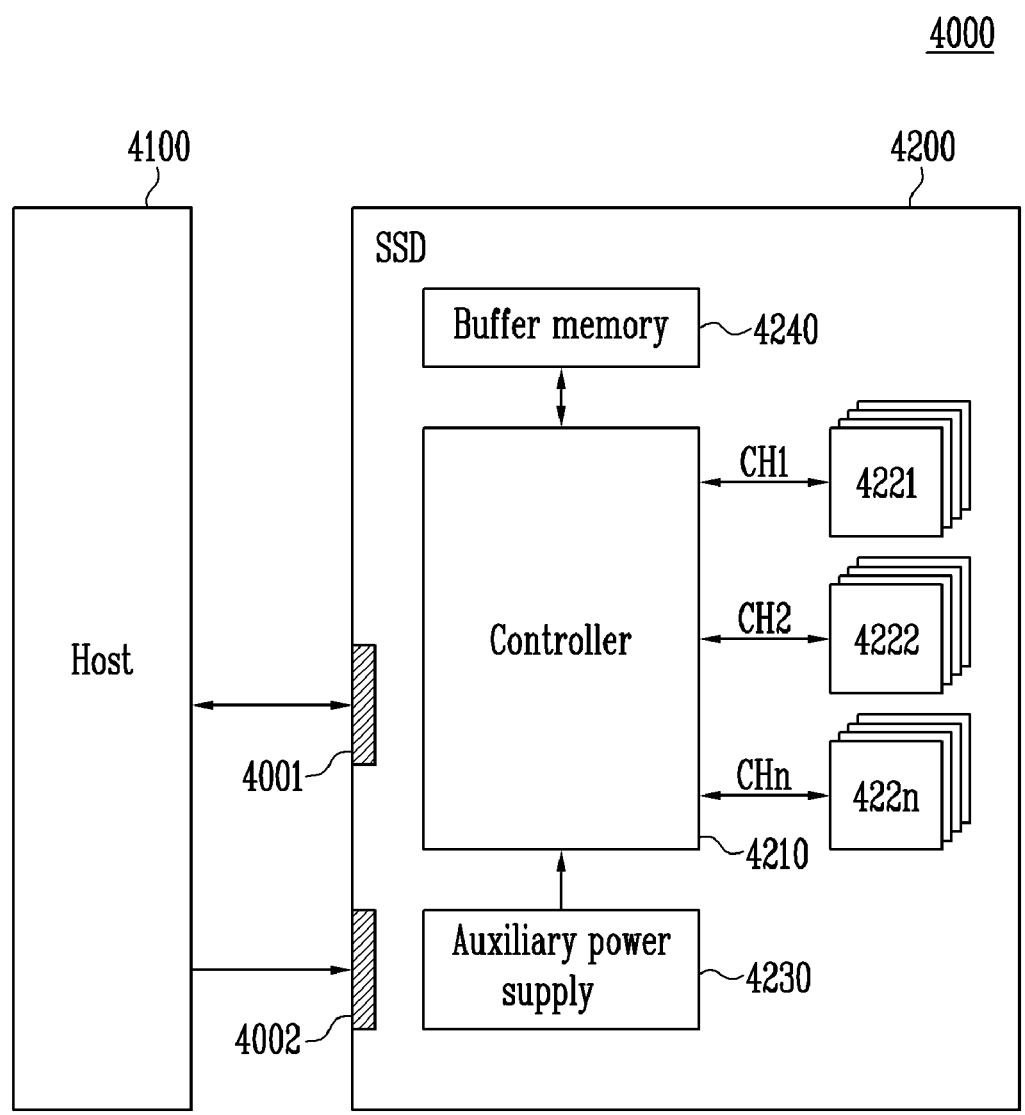
FIG. 8 is a diagram illustrating a solid-state drive (SSD) system to which a memory device according to an embodiment of the present disclosure is applied.

FIG. 8 is a diagram illustrating a solid state drive (SSD) system to which a memory device according to an embodiment of the present disclosure is applied.

Referring to FIG. 8, an SSD system 4000 may include a host 4100 and an SSD 4200. The SSD 4200 may exchange a signal with the host 4100 through a signal connector 4001, and may receive power through a power connector 4002. The SSD 4200 may include a controller 4210, a plurality of memory devices 4221 to 422n, an auxiliary power supply 4230, and a buffer memory 4240.

The controller 4210 may control the plurality of memory devices 4221 to 422n in response to signals received from the host 4100. In an embodiment, the received signals may be signals based on the interfaces of the host 4100 and the SSD 4200. For example, the signals may be defined by at least one of various interfaces such as universal serial bus (USB), multimedia card (MMC), embedded MMC (eMMC), peripheral component interconnection (PCI), PCI-express (PCI-E), advanced technology attachment (ATA), serial-ATA (SATA), parallel-ATA (PATA), small computer system interface (SCSI), enhanced small disk interface (ESDI), integrated drive electronics (IDE), firewire, universal flash storage (UFS), WiFi, Bluetooth, and nonvolatile memory express (NVMe).

Each of the plurality of memory devices 4221 to 422n may include cells in which data can be stored. Each of the memory memories 4221 to 422n may be configured in the same manner as the memory device 100 illustrated in FIG. 1.

The auxiliary power supply 4230 may be coupled to the host 4100 through the power connector 4002. The auxiliary power supply 4230 may be supplied with a power supply voltage from the host 4100, and may be charged. The auxiliary power supply 4230 may provide the power supply voltage of the SSD 4200 when the supply of power from the host 4100 is not smoothly performed. In an embodiment, the auxiliary power supply 4230 may be located inside the SSD 4200 or located outside the SSD 4200. For example, the auxiliary power supply 4230 may be located in a main board, and may also provide auxiliary power to the SSD 4200.

The buffer memory 4240 may function as a buffer memory of the SSD 4200. For example, the buffer memory 4240 may temporarily store data received from the host 4100 or data received from the plurality of memory devices 4221 to 422n, or may temporarily store metadata (e.g., mapping tables) of the memory devices 4221 to 422n. The buffer memory 4240 may include volatile memories, such as a dynamic random access memory (DRAM), a synchronous DRAM (SDRAM), a double data rate (DDR) SDRAM, and a low power DDR (LPDDR) SDRAM, or nonvolatile memories, such as a ferroelectric RAM (FRAM), a resistive RAM (ReRAM), a spin transfer torque magnetic RAM (STT-MRAM), and a phase-change RAM (PRAM).

The present disclosure, for an embodiment, may prevent a bridge from being generated when a dummy contact of a memory device is formed, thereby increasing the yield of a process of manufacturing memory devices.

What is claimed is:

1. A memory device, comprising:
   a connection structure formed on a substrate;
   lower contacts formed on the connection structure;
   upper contacts formed on the lower contacts;
   a dummy pattern configured to enclose the lower contacts and spaced apart from the lower contacts;
   etching stop patterns formed in an upper region of the dummy pattern; and
   dummy contacts formed over the etching stop patterns.

2. The memory device according to claim 1, further comprising:
   a transistor configured to transfer or block a voltage between the connection structure and the lower contacts.

3. The memory device according to claim 1, wherein the lower contacts contact the connection structure by vertically passing through an insulating pattern enclosed by the dummy pattern.

4. The memory device according to claim 1, wherein the upper contacts contact the lower contacts by vertically passing through a stacked structure formed over the lower contacts, the dummy pattern, and the etching stop patterns.

5. The memory device according to claim 1, wherein the lower contacts and the upper contacts are used as main contacts that are electrically connected to a ground terminal formed in the substrate through the connection structure.

6. The memory device according to claim 1, wherein the lower contacts, the upper contacts, and the dummy contacts are formed of an identical material.

7. The memory device according to claim 1, wherein widths of the upper contacts are equal to widths of the dummy contacts.

8. The memory device according to claim 1, wherein the dummy pattern comprises:
   a first conductive layer;
   a first insulating layer formed on the first conductive layer;
   a second conductive layer formed on the first insulating layer;
   a second insulating layer formed on the second conductive layer; and
   a third conductive layer formed on the second insulating layer.

9. The memory device according to claim 1, wherein the etching stop patterns are formed of a conductive material.

10. The memory device according to claim 1, wherein the etching stop patterns are formed of at least one of tungsten (W), titanium (Ti), and titanium nitride (TiN).

11. A method of manufacturing a memory device, comprising:
  providing a substrate in which a cell region and a peripheral region are defined;
  forming conductive patterns on the substrate of the cell region and the peripheral region;
  forming a lower contact between the conductive patterns in the peripheral region;
  forming etching stop patterns in the conductive patterns in the cell region and the peripheral region;
  forming a stacked structure on the etching stop patterns;
  forming holes configured to respectively expose the lower contact and the etching stop pattern in the stacked structure in the peripheral region; and
  forming a dummy contact contacting portions of the etching stop patterns and an upper contact contacting the lower contact by filling the holes formed in the peripheral region with a conductive material.

12. The method according to claim 11, further comprising:
  before forming the conductive patterns on the substrate, forming a junction region in the substrate; and
  forming a connection structure on the junction region.

13. The method according to claim 12, wherein the lower contact is formed to contact the connection structure.

14. The method according to claim 11, wherein:
  patterns formed in the cell region, among the etching stop patterns, are formed along a direction in which a slit separating memory blocks extends, and
  patterns formed in the peripheral region, among the etching stop patterns, are formed in a region in which the dummy contact is to be formed.

15. The method according to claim 11, wherein the etching stop patterns are formed of at least one of tungsten (W), titanium (Ti), and titanium nitride (TiN).

16. The method according to claim 11, wherein the etching stop patterns are formed of a mixture of at least two of tungsten (W), titanium (Ti), and titanium nitride (TiN).

17. The method according to claim 11, wherein forming the holes is performed by an etching process for removing a portion of the stacked structure in a vertical direction.

18. The method according to claim 11, further comprising:
  between forming the stacked structure and forming the holes,
  forming cell plugs passing through the stacked structure in the cell region;
  forming a slit exposing the etching stop pattern by passing through the stacked structure between the cell plugs;
  forming a recess by removing the etching stop pattern and a portion of the conductive pattern formed below the slit;
  filling the recess with a conductive material;
  removing sacrificial patterns included in the stacked structure in the cell region; and
  forming gate lines in regions from which the sacrificial patterns are removed.

19. The method according to claim 18, wherein forming the cell plugs comprises:
  forming a vertical hole passing through the stacked structure formed in the cell region; and
  forming a blocking layer, a charge trap layer, a tunnel isolation layer, a channel layer, and a core pillar from a side surface of the vertical hole.

20. The method according to claim 18, wherein forming the slit is performed by an etching process for separating the stacked structure formed in the cell region in a first direction.

* * * * *